United States Patent
Bash et al.

(10) Patent No.: US 7,995,339 B2
(45) Date of Patent: Aug. 9, 2011

(54) CONTROL OF VENT TILES CORRELATED WITH A RACK

(75) Inventors: Cullen E. Bash, San Francisco, CA (US); Chandrakant D. Patel, Fremont, CA (US); Ratnesh K. Sharma, Union City, CA (US); Abdlmonem Beitelmal, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1277 days.

(21) Appl. No.: 10/976,786

(22) Filed: Nov. 1, 2004

(65) Prior Publication Data

US 2006/0091229 A1    May 4, 2006

(51) Int. Cl.
 *H05K 7/20* (2006.01)
 *G01M 1/38* (2006.01)
 *F25D 23/12* (2006.01)
 *F24F 7/00* (2006.01)

(52) U.S. Cl. ...... 361/692; 361/695; 62/259.2; 236/49.3; 700/276

(58) Field of Classification Search .................... 62/180, 62/259.2, 89, 186, 325, 178; 361/694, 695, 361/696, 692; 454/184, 245, 253; 700/276–278, 300

See application file for complete search history.

(56) References Cited

U.S. PATENT DOCUMENTS

| | | | |
|---|---|---|---|
| 6,574,104 B2 * | 6/2003 | Patel et al. | 361/695 |
| 6,868,682 B2 * | 3/2005 | Sharma et al. | 62/180 |
| 7,031,154 B2 * | 4/2006 | Bash et al. | 361/690 |

* cited by examiner

*Primary Examiner* — Cheryl J Tyler
*Assistant Examiner* — John F Pettitt

(57) ABSTRACT

In a method of controlling vent tiles, the vent tiles are initially correlated with at least one rack. A vent tile family (VTF) of the at least one rack is determined, where the VTF includes vent tiles that have at least a predefined level of influence over the at least one rack as determined by the correlation between the vent tiles and the at least one rack. In addition, a vent control family (VCF) from the vent tiles in the VTF is identified, where the VCF includes vent tiles having an associated at least one rack whose inlet condition is outside of a predefined threshold. Moreover, the vent tiles in the VCF are controlled on a weighted basis determined by the correlation between the vent tiles and the at least one rack.

18 Claims, 9 Drawing Sheets

CONTROL OF VENT TILES CORRELATED WITH A RACK

CROSS-REFERENCE TO RELATED APPLICATIONS

This application is related to commonly assigned and copending U.S. patent application Ser. Nos. 10/960,573, entitled "Correlation of Vent Tiles and Racks", and 10/960,574, entitled "Correlation of Vent Tile Settings and Rack Temperatures", both of which were filed on Oct. 8, 2004 and are hereby incorporated by reference in their entireties.

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Data centers are typically equipped with a raised floor with vent tiles configured to provide cool air to the computer systems from a pressurized plenum in the space below the raised floor. In certain instances, these vent tiles contain manually adjustable dampers for varying the flow rate of cool air therethrough. However, because these vent tiles cannot be remotely controlled, they are typically unable to vary the airflow to dynamically provision the data center with cooling resources. In addition, these vent tiles are typically manually actuated without knowledge of how each vent tile affects computer systems in its proximity. These actuations frequently have unintended consequences, such as, inadequate airflow delivery to the racks, adverse re-circulation of heated and cooled airflows, and wasted energy consumption. This may lead to inefficiencies in both cooling of the computer systems as well as in the operations of air conditioning units.

In other instances, automated vent tiles have been used in data centers to generally enable remote actuation of the vent tiles via feedback control algorithms. Conventional automated vent tiles are typically operated, however, without substantially accurate knowledge of how actuations of these vent tiles affect airflow in the data center. A process for associating vent tiles with racks and for controlling the vent tiles to enable relative accurate airflow delivery to the racks would therefore be desirable.

SUMMARY OF THE INVENTION

According to an embodiment, the present invention pertains to a method of controlling vent tiles. In the method, the vent tiles are correlated with at least one rack. A vent tile family (VTF) of the at least one rack is determined, where the VTF includes vent tiles that have at least a predefined level of influence over the at least one rack as determined by the correlation between the vent tiles and the at least one rack. In addition, a vent control family (VCF) from the vent tiles in the VTF is identified, where the VCF includes vent tiles having an associated at least one rack whose inlet condition is outside of a predefined threshold. Moreover, the vent tiles in the VCF are controlled on a weighted basis determined by the correlation between the vent tiles and the at least one rack.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
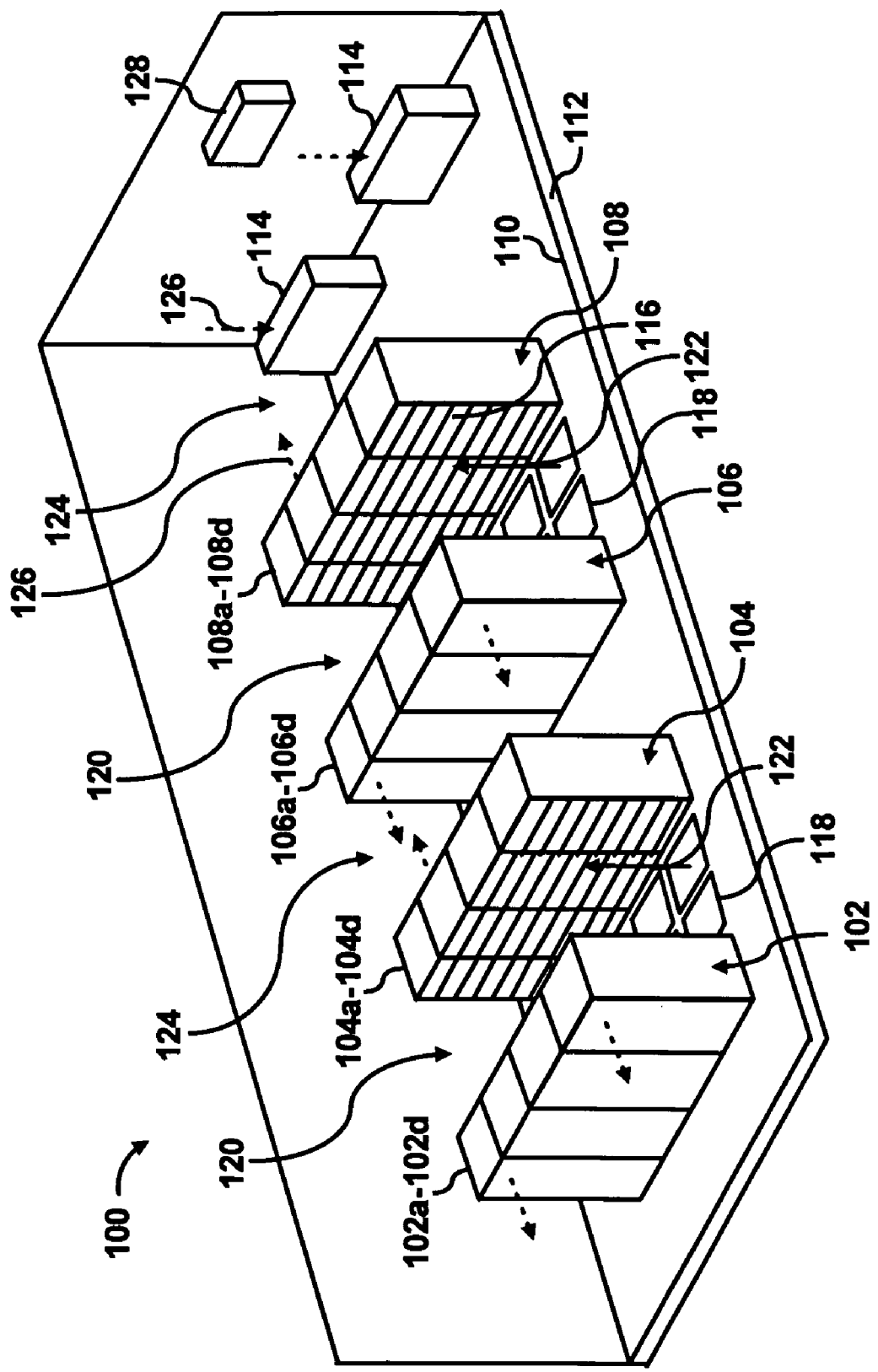
FIG. 1A shows a simplified perspective view of a data center according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to various embodiments, characteristics of cooled airflow delivered to racks in a building are controlled. In one instance, the characteristic comprises mass flow rate of cooled airflow, which is controlled to generally ensure that a specified minimum amount of airflow is delivered to each of the racks. The specified minimum amount of airflow delivered to each of the racks may be equal to, for instance, at least 100% of the measured/estimated flow rates of the racks. In another instance, the characteristic comprises temperature of the airflow, which is controlled to generally ensure that airflow having a specified minimum temperature flows through the racks to enable sufficient heat transfer from the components contained in the racks.

Relationships between the racks and vent tiles are correlated such that certain ones of the vent tiles may be operated in various manners to thereby control the characteristics of the cooled air delivered into various racks. In a first example, the relationships are based upon a vent tile influence coefficient (VTI). The VTI is disclosed in co-pending and commonly assigned U.S. patent application Ser. No. 10/960,573, entitled "Correlation of Vent Tiles and Racks", and filed on Oct. 8, 2004, the disclosure of which is hereby incorporated by reference in its entirety. In a second example, the relationships are based upon a vent tile opening index (VTO), which is disclosed in co-pending and commonly assigned U.S. patent application Ser. No. 10/960,574, entitled "Correlation of Vent Tile Settings and Rack Temperatures", and filed on Oct. 8, 2004, the disclosure of which is hereby incorporated by reference in its entirety.

An algorithm is implemented to control the vent tiles to thereby control the characteristics of cooled airflow through the vent tiles according to their relationships with the various racks. The algorithm may determine which of the vent tiles have at least a predetermined minimum level of influence over particular racks and may classify these vent tiles into groups or families. For purposes of simplicity and not of limitation, a set of vent tiles having the predetermined minimum level of influence over a particular rack is considered as being in a vent tile family (VTF). Other sets of vent tiles having predetermined minimum levels of influence over other racks are also considered as being in respective VTFs. In addition, the vent tiles may be included in a plurality of VTFs.

The algorithm is designed to control subsets of vent tiles contained in respective VTFs. The subsets may include vent tiles whose associated racks are receiving cool air at flow rates outside of prescribed ranges (minimum and maximum flow rates). Alternatively, the subsets of vent tiles may be based upon rack inlet temperatures being outside of prescribed ranges (minimum and maximum flow rates). In any regard, these subsets of vent tiles may be considered as vent control families (VCFs) for purposes of simplicity and not of limitation.

The vent tiles in the VCFs may be controlled under a hierarchical control scheme. For instance, vent tiles in the VCFs may be controlled on a rack-level basis. Some of the vent tiles, however, that are not being used to control the cooled airflow delivery into the racks may be controlled on a row-level or multi-rack level basis. Again, some of the vent tiles that are not being used to control the cooled airflow delivery on a row-level or multi-rack level basis may be controlled on a zonal basis. In this regard, vent tiles that are not being controlled to achieve rack-level goals may be employed to achieve larger-scale goals in the data center.

Although particular reference is made throughout the present disclosure to air conditioning units and vent tiles in data centers for cooling racks, it should be understood that certain principles presented herein may be applied to cooling systems in other types of buildings. For instance, correlations between ceiling mounted air supply vent tiles and various areas of a room containing a sensor network may be made using VTI. In this example, VTI may be used to develop control algorithms that operate the air supply vent tiles to ensure that the various areas of the room receive desired levels of airflow. Thus, the descriptions presented herein with respect to VTI should not be construed as being limited solely to data centers, but that the data center environment is an example of a suitable application of the principles presented herein.

With reference first to FIG. 1A, there is shown a simplified perspective view of a data center 100 which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the data center 100 depicted in FIG. 1A represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102-108, for instance, electronics cabinets, aligned in parallel rows. Each of the rows of racks 102-108 is shown as containing four racks (a-d) positioned on a raised floor 110. A plurality of wires and communication lines (not shown) may be located in a space 112 beneath the raised floor 110. The space 112 may also function as a plenum for delivery of cooled air from one or more computer room air conditioning (CRAC) units 114 to the racks 102-108. The cooled air may be delivered from the space 112 to the racks 102-108 through vent tiles 118 located between some or all of the racks 102-108. The vent tiles 118 are shown as being located between racks 102 and 104 and 106 and 108.

In general, the flow rate of air delivered into the racks 102-108 is determined by air movers (for instance, blowers, fans, etc.) located in components 116 housed in the racks and the airflow resistance of the components 116. In addition, the air delivered into the racks 102-108 typically contains airflow supplied by a multiplicity of vent tiles 118 and, in certain instances, from heated air exhausted into the data center 100 that infiltrates the intakes of the racks 102-108.

As previously described, the CRAC units 114 generally operate to supply cooled air into the space 112. The cooled air contained in the space 112 may include cooled air supplied by one or more CRAC units 114. Thus, characteristics of the cooled air, such as, temperature, pressure, flow rate, etc., may substantially be affected by one or more of the CRAC units 114. By way of example, the cooled air supplied by one CRAC unit 114 may mix with cooled air supplied by another CRAC unit 114. In this regard, characteristics of the cooled air at various areas in the space 112 and the cooled air supplied to the racks 102-108 may vary, for instance, if the temperatures or the volume flow rates of the cooled air supplied by these CRAC units 114 differ due to mixing of the cooled air. In certain instances, the level of influence of a CRAC unit 114 over the racks 102-108 may be higher for those racks 102-108 that are in closer proximity to the CRAC unit 114. In addition, the level of influence of a CRAC unit 114 over the racks 102-108 may be lower for those racks 102-108 that are located farther away from the CRAC unit 114.

The vent tiles 118 may comprise manually or remotely adjustable vent tiles. In this regard, the vent tiles 118 may be manipulated to vary, for instance, the mass flow rates of cooled air supplied to the racks 102-108. In addition, the vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104 patent, the vent tiles 118 are termed "dynamically controllable" because they generally operate to control at least one of velocity, volume flow rate and direction of the cooled airflow therethrough. In addition, specific examples of dynamically controllable vent tiles 118 may be found in U.S.

Pat. No. 6,694,759, filed on Jan. 27, 2003, which is assigned to the assignee of the present invention and is incorporated by reference herein in its entirety.

The vent tiles 118 may have differing levels of influence over the conditions affecting various racks 102-108 depending upon, for example, the relatively locations of the vent tiles 118 from the racks 102-108, airflow conditions in the data center 100, airflow characteristics through other vent tiles 118, etc. Thus, for instance, a vent tile 118 located in close proximity to the rack 102a may have greater levels of influence over the airflow conditions delivered into the rack 102a as compared with a vent tile 118 located relative it from the 102a. The levels of influence the vent tiles 118 have over various racks 102-108 may be considered as the vent tile influence coefficient (VTI), which is described in greater detail in U.S. patent application Ser. No. 10/960,573, entitled "Correlation of Vent Tiles and Racks", filed on Oct. 8, 2004. As described in that application, in its simplest form, the mass flow rates or airflow through the racks 102-108 is equal to the VTI multiplied by the mass flow rates of airflow through the vent tiles 118, or in equation form:

$$[M_R]=[VTI]\cdot[M_{VT}], \quad \text{Equation (1):}$$

where $[M_R]$ is the vector of mass flow rates of air delivered to each rack 102a-102n and $[M_{VT}]$ is the vector of mass flow rates of air through each vent tile 118, of a particular group of racks 102-108 and vent tiles 118. In addition, units of $M_R$ and $M_{VT}$ may be in kg/s, and VTI is dimensionless.

Thus, once the VTI is determined, and a particular mass flow rate of cool airflow is desired through a particular rack, for instance, rack 102a, one or more of the vent tiles 118 may be manipulated to generate the mass flow rates of cool airflow through the one or more of the vent tiles 118 as dictated by Equation (1). Manipulation of the vent tiles 118 may include varying the degree to which the vent tiles 118 are open to thus control the mass flow rate of airflow therethrough. In addition, or alternatively, manipulation of the vent tiles 118 may include varying the speed at which a fan 154 (FIG. 1C) is rotated to thus vary the mass flow rate of airflow supplied through the vent tiles 118.

In another example, the levels of influence the vent tiles 118 have over various racks 102-108 may be considered as the vent tile opening index (VTO). Manners in which VTO is calculated is described in greater detail in U.S. patent application Ser. No. 10/960,574, entitled "Correlation of Vent Tile Settings and Rack Temperatures", filed on Oct. 8, 2004. As described in that application, in its simplest form, the change in temperature of airflow at the inlets of the racks 102-108 is equal to the VTO multiplied by the changes in the openings of the vent tiles 118 or the changes in vent tile 118 fan settings, which may be written in equation form as follows:

$$[\Delta T_R]=[VTO]\cdot[\Delta TO], \quad \text{Equation (2):}$$

where $[\Delta T_R]$ is a matrix of changes in inlet temperatures of air delivered to each rack 102-108 and $[\Delta TO]$ is a tile opening matrix of each vent tile 118, of a particular group of racks 102-108 and vent tiles 118.

Thus, once the VTO is determined, and a particular change in temperature of the airflow delivered into a particular rack is desired, for instance, rack 102a, one or more of the vent tiles 118 may be manipulated to vary the tile opening matrix as dictated by Equation (2). For purposes of simplicity, the vent tile openings and vent tile fan speeds are considered to be synonymous. Thus, where reference is made in the present disclosure that a vent tile 118 is open to a certain percentage, this reference is to be understood as also being equivalent to a vent tile fan 154 (FIG. 1C) being operated to that percentage. For instance, if a vent tile 118 is considered as being 90% open, an equivalent state for a vent tile 118 equipped with a fan 154 is when the fan 154 is operated at 90% of its maximum rated speed.

The racks 102-108 are generally configured to house a plurality of components 116 capable of generating/dissipating heat (not shown), for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like. In the performance of these electronic functions, the components, and therefore the subsystems, may generally dissipate relatively large amounts of heat. Because the racks 102-108 have generally been known to include upwards of forty (40) or more subsystems, they may transfer substantially large amounts of heat to the cooled air flowing therethrough to maintain the subsystems and the components generally within predetermined operating temperature ranges.

The areas between the racks 102 and 104 and between the racks 106 and 108 may comprise cool aisles 120. These aisles are considered "cool aisles" because they are configured to receive cooled airflow from the vent tiles 118, as generally indicated by the arrows 122. In addition, the racks 102-108 generally receive cooled air from the cool aisles 120. The aisles between the racks 104 and 106, and on the rear sides of racks 102 and 108, are considered hot aisles 124. These aisles are considered "hot aisles" because they are positioned to receive air that has been heated by the components 116 in the racks 102-108, as indicated by the arrows 126. By substantially separating the cool aisles 120 and the hot aisles 124, for instance, with the racks 102-108, the heated air may substantially be prevented from re-circulating with the cooled air prior to delivery into the racks 102-108. In addition, the cooled air may also substantially be prevented from re-circulating with the heated air prior to returning to the CRAC units 114. However, there may be areas in the data center 100 where re-circulation of the cooled air and the heated air occurs. By way of example, cooled air may mix with heated air around the sides or over the tops of one or more of the racks 102-108.

The sides of the racks 102-108 that face the cool aisles 120 may be considered as the fronts of the racks and the sides of the racks 102-108 that face away from the cool aisles 120 may be considered as the rears of the racks 102-108. For purposes of simplicity and not of limitation, this nomenclature will be relied upon throughout the present disclosure to describe the various sides of the racks 102-108.

According to another example, the racks 102-108 may be positioned with their rear sides adjacent to one another (not shown). In this embodiment, the vent tiles 118 may be provided in each aisle 120 and 124. In addition, the racks 102-108 may comprise outlets on top panels thereof to enable heated air to flow out of the racks 102-108.

As described herein above, the CRAC units 114 generally operate to cool received heated air as indicated by the arrows 126. In addition, the CRAC units 114 may supply the racks 102-108 with airflow that has been cooled, through any reasonably suitable known manners and may thus comprise widely available, conventional CRAC units 114. For instance, the CRAC units 114 may comprise vapor-compression type air conditioning units, chiller type air conditioning units, etc. Examples of suitable CRAC units 114 may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a computing device 128 configured to control various operations of the data center 100. The computing device 128 may be configured, for instance, to control the vent tiles 118 to thereby vary at least one of a direction and a volume flow rate of cooled airflow delivered through the vent tiles 118. In one regard, the computing device 128 may control the vent tiles 118 to move from fully closed positions to fully open positions. In addition, the computing device 128 may be configured to calculate at least one of the VTI and the VTO as described herein above. The computing device 128 may also be configured to operate one or more algorithms to control the vent tiles 118 based upon the calculated VTI or VTO. The programming of the computing device 128 to execute the one or more algorithms based upon either or both of the VTI and the VTO may substantially be predicated upon the types of sensors positioned at various locations of the data center 100. By way of example, if a vent tile 118 is not equipped with a sensor for detecting its opening percentage, the computing device 128 may execute an algorithm based upon the calculated VTI. In addition, the computing device 128 may execute a first algorithm based upon VTI for certain sections of the data center 100 while executing a second algorithm based upon VTO for other sections of the data center.

Although the computing device 128 is illustrated in FIG. 1A as comprising a component separate from the components 116 housed in the racks 102-108, the computing device 128 may comprise one or more of the components 116 without departing from a scope of the data center 100 disclosed herein. In addition, the data center 100 is illustrated in FIG. 1A as containing four rows of racks 102-108 and two CRAC units 114 for purposes of simplicity of illustration. Thus, the data center 100 should not be limited in any respect based upon the number of racks 102-108 and CRAC units 114 illustrated in FIG. 1A. In addition, although the racks 102-108 have all been illustrated similarly, the racks 102-108 may comprise heterogeneous configurations. For instance, the racks 102-108 may be manufactured by different companies or the racks 102-108 may be designed to house differing types of components 116, for example, horizontally mounted servers, bladed servers, etc.

Figure 1B:
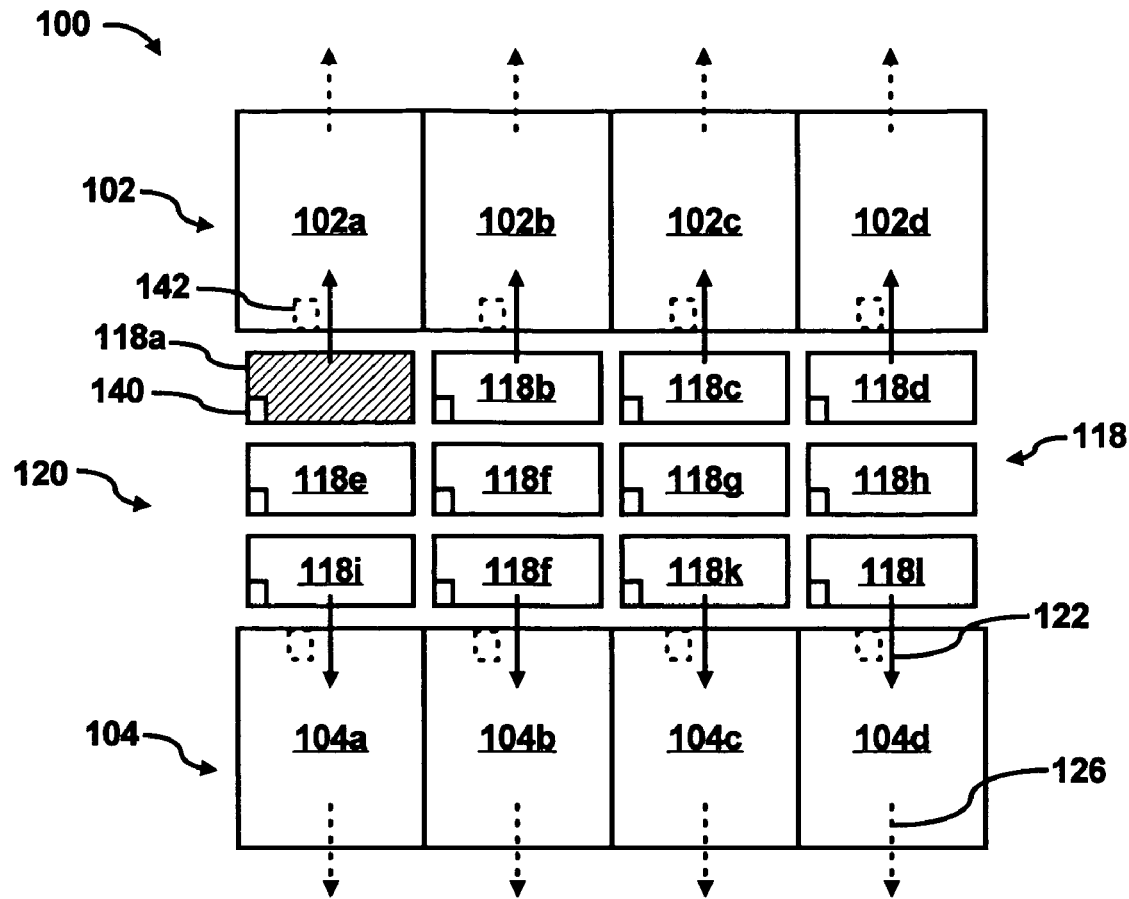
FIG. 1B illustrates a simplified plan view of a portion of the data center shown in FIG. 1A, according to an embodiment of the invention.

Various manners in which the cooled airflow is supplied by the vent tiles 118 to the racks 102-108 will be described in greater detail with respect to FIG. 1B. FIG. 1B illustrates a simplified plan view of a portion of the data center 100. More particularly, FIG. 1B illustrates the portion of the data center 100 including rows of racks 102 and 104 and a cool aisle 120. It should be understood that the description set forth herein below with respect to FIG. 1B is also applicable to the other rows of racks 106 and 108 and cool aisles 120.

The vent tiles 118 are illustrated in FIG. 1B as comprising a plurality of separately controllable vent tiles 118a-118l. The number of vent tiles 118a-118l depicted in FIG. 1B are for purposes of illustration only and are thus not meant to limit the data center 100 in any respect. In addition, although the vent tiles 118a-118l are shown as being positioned with respect to respective racks 102a-102d and 104a-104d, such placement of the vent tiles 118a-118l are also not to be construed as limiting the data center 100 in any respect.

As described herein above with respect to FIG. 1A, the vent tiles 118a-118l are in fluid communication with a space 112 or plenum containing pressurized cooled air supplied into the space 112 by one or more CRAC units 114. For those vent tiles 118a-118l that are open, the cooled air may be supplied into an area above the vent tiles 118a-118l. The cooled air supplied into the area by the open vent tiles 118a-118l may be drawn into the racks 102a-102d and 104a-104d through openings or inlets in the racks 102a-102d and 104a-104d, as indicated by the arrows 122, in a variety of different manners. For instance, the components 116 housed in the racks 102a-102d and 104a-104d may include fans (not shown) operable to draw airflow into the front sides of the racks 102a-102d and 104a-104d and to discharge air out of the rear sides of the racks 102a-102d and 104a-104d. In addition or alternatively, the racks 102a-102d and 104a-104d may be equipped with one or more fans (not shown) configured to create similar airflows through the racks 102a-102d and 104a-104d. The vent tiles 118a-118l may also be designed to assist in the supply of airflow through the racks 102a-102d and 104a-104d through control of the direction of the airflow supplied.

As the cooled air flows through the racks 102a-102d and 104a-104d and therefore the components 116, the cooled air may become heated by absorbing heat dissipated from the components 116. The heated air may exit the racks 102a-102d and 104a-104d through one or more outlets located on the rear sides of the racks 102a-102d and 104a-104d, as indicated by the arrows 126.

The vent tile 118a is illustrated as being in a fully closed position; whereas, the vent tiles 118b-118l are illustrated as being in fully open positions. However, the rack 102a may still draw cooled airflow from the area above the vent tiles 118a-118l as indicated by the arrow 122. The airflow drawn into the rack 102a may comprise airflow supplied into the area by one or more of the vent tiles 118b-118l. In addition, the airflow drawn into the rack 102a, as well as the other racks 102b-102d and 104a-104d, may also comprise airflow that has been heated, for instance, in one or more of the racks 102a-102d and 104a-104d. This airflow may be considered as re-circulated airflow since the heated airflow may have re-circulated into the cooled airflow.

The vent tiles 118a-118l may each include sensors 140 configured to detect one or more conditions of the cooled airflow supplied through the vent tiles 118a-118l. For instance, the sensors 140 may be equipped to detect the temperature of the airflow supplied through respective vent tiles 118a-118l. In this regard, the sensors 140 may include thermistors, thermocouples, or the like. As another example, the sensors 140 may be equipped to detect the mass flow rates of the airflow supplied through respective vent tiles 118a-118l. Thus, for instance, the sensors 140 may comprise anemometers or the like. Alternatively, the mass flow rates of airflow through the vent tiles 118a-118l may be estimated through a determination of, for instance, the pressure in the space 112 and the percentages that the vent tiles 118a-118l are open.

As a further alternative, the sensors 140 may detect the level or percentage at which the respective vent tiles 118a-118l are open. The sensors 140 may comprise any reasonably suitable commercially available device for detecting or for enabling the calculation of the level or percentage to which the vent tiles 118a-118l are open. For instance, the sensors 140 may comprise encoders configured to detect movement of movable louvers or vanes configured to vary the degree to which the vent tiles 118a-118l are open and thereby vary the mass flow rate of airflow supplied through the vent tiles 118a-118l.

Figure 1C:
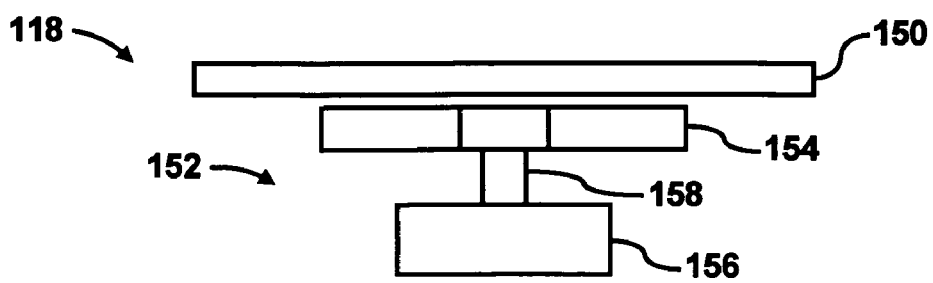
FIG. 1C illustrates a simplified side elevational view of an example of a vent tile shown in FIG. 1B.

Some or all of the vent tiles 118a-118l may also comprise fans, as shown in FIG. 1C. FIG. 1C illustrates a simplified side elevational view of a vent tile 118a-118l having a cover 150 and a fan assembly 152. The cover 150 includes a plurality of openings (not shown) to enable substantially unimpeded airflow through the cover 150. The fan assembly 152 includes a fan 154 connected to a motor 156 by a rod 158. The motor 156 may be operated at various speeds to thereby vary the speed of the fan 154 and thus the mass flow rate of air supplied through the cover 150. The vent tiles 118a-118l may be considered as being closed when the fans 154 are not rotating. In addition, the different speeds at which the fans 154 are rotated may be equivalent to the percentages that the vent tiles 118a-118l are considered open. Thus, for instance, if a vent tile 118a-118l is considered as being 90% open, an equivalent state for a vent tile 118a-118l equipped with a fan 154 is when the fan 154 is operated at 90% of its maximum rated speed. The sensors 140 may detect the speeds of the fans 154 by detecting the operations of the motors 156. For instance, the sensors 140 may comprise encoders configured to detect the speed at which the motor 156 is rotating, power meter to detect the power draw of the motor 156, and the like.

The racks 102a-102d and 104a-104d, may each also include sensors 142 configured to detect one or more conditions of the airflow drawn through the racks 102a-102d and 104a-104d. The sensors 142 may, for instance, be equipped to detect the respective temperatures of the air flowing into each of the racks 102a-102d and 104a-104d and may thus, include thermistors, thermocouples, or the like. In addition, the sensors 142 may be equipped to detect the mass flow rates of air flowing through the respective racks 102a-102d and 104a-104d and may thus include anemometers or the like. Alternatively, the mass flow rates of airflow through the racks 102a-102d and 104a-104d may be estimated through a determination of, for instance, the temperature increases from the inlets of the racks 102a-102d and 104a-104d to the outlets of the racks 102a-102d and 104a-104d along with the power drawn by the components 116 contained in the respective racks 102a-102d and 104a-104d, the speeds of various fans contained in the respective racks 102a-102d and 104a-104d, etc.

Figure 2A:
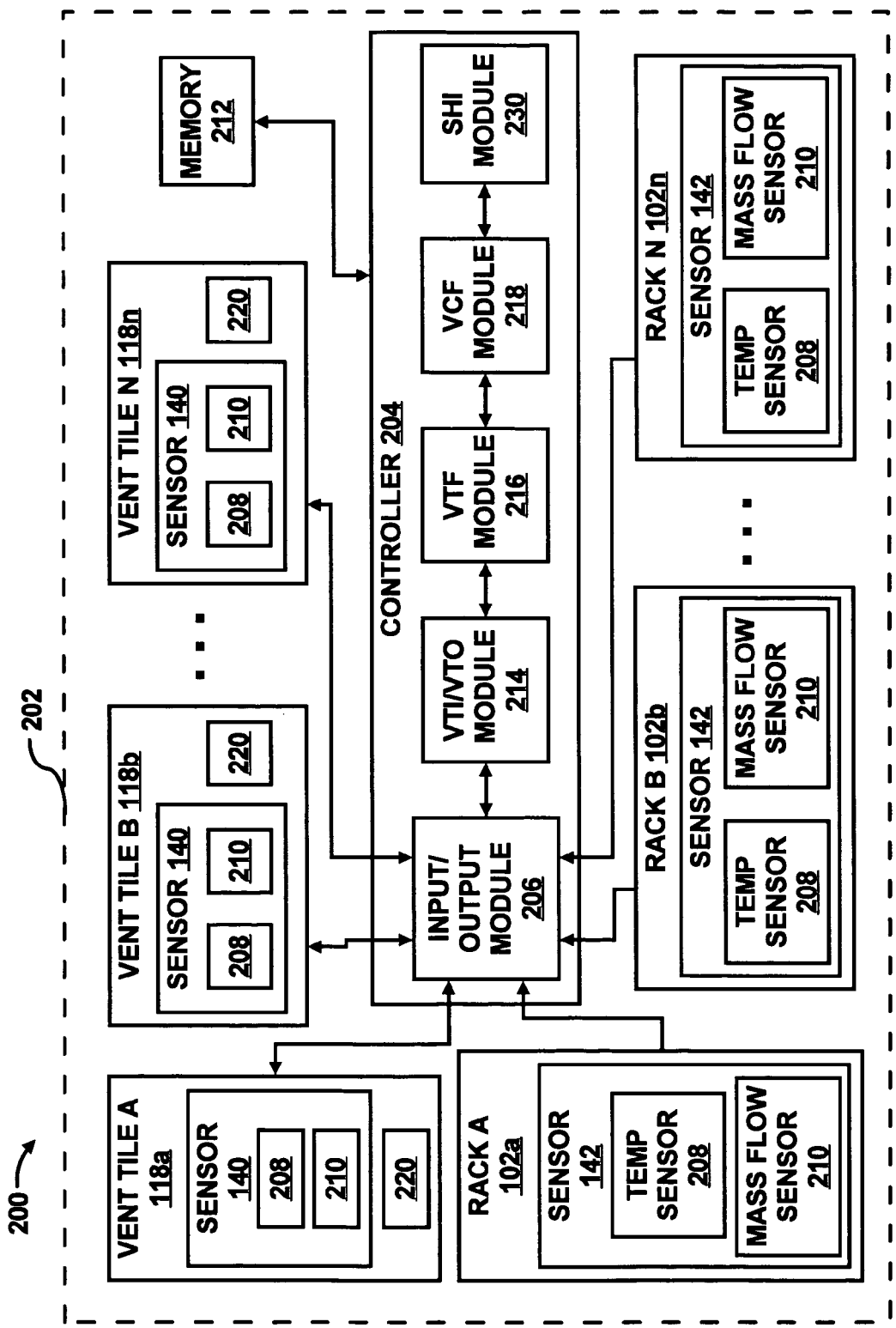
FIG. 2A is a block diagram of a vent tile control system according to an embodiment of the invention.

FIG. 2A is a block diagram 200 of a vent tile control system 202. It should be understood that the following description of the block diagram 200 is but one manner of a variety of different manners in which such a system 202 may be operated. In addition, it should be understood that the system 202 may include additional components and that some of the components described may be removed and/or modified without departing from a scope of the system 202.

The vent tile control system 202 includes a controller 204 configured to control the operations of the system 202. The controller 204 may, for instance, comprise the computing device 128 shown in FIG. 1A. In addition or alternatively, the controller 204 may comprise a different computing device, a microprocessor, a micro-controller, an application specific integrated circuit (ASIC), and the like. In general, the controller 204 is configured to receive data from various components in the data center 100, to process the data, and to control one or more of the vent tiles 118a-118n based upon the processed data, as described in greater detail herein below.

The controller 204 includes an input/output module 206 configured to receive data pertaining to measured or estimated conditions detected at a variety of locations in the data center 100. The input/output module 206 may also be configured to output various commands and other data by the controller 204 as described below. As shown in FIG. 2A, the input/output module 206 is configured to receive data from the sensors 140 of a plurality of vent tiles 118a-118n and from the sensors 142 of a plurality of racks 102a-102n. The sensors 140 and 142 may comprise various types of sensors. For instance, the sensors 140 and 142 may include temperature sensors 208 and mass flow rate sensors 210.

As an alternative to mass flow rate sensors 210, the mass flow rates of airflow through the vent tiles 118a-118n and the racks 102a-102n may be estimated by the controller 204 through various other means. For instance, the mass flow rates may be estimated through use of temperature drop detection along with power draw detection, pressure differences, fan speeds, etc. Thus, although mass flow rate sensors 210 are explicitly shown in FIG. 2A, it should be understood that these sensors 210 may be omitted without departing from a scope of the system 202. Alternatively, the sensors 140 may instead include proximity sensors or limit switches which may be used to estimate the openings of the vent tiles 118a-118n.

In certain instances, for example, when VTO is calculated, the sensors 140 may also comprise sensors configured to detect the temperature of airflow supplied through the vent tiles 118a-118n. In this regard, the sensors 140 may comprise thermometers, thermocouples, thermistors, etc. In addition, the temperature information detected by the sensors 140 may also be sent to the input/output module 206.

The controller 204 may receive data from the sensors 140 and 142 through any reasonably suitable means. For instance, communications between the controller 204 and the sensors 140 and 142 may be effectuated through wired connections or through wireless protocols, such as IEEE 801.11b, 801.11g, wireless serial connection, Bluetooth, etc., or combinations thereof. In one regard, the input/output module 206 may thus also function as an adapter to enable the transfer of data from the sensors 140 and 142 to the controller 204.

Although the vent tiles 118a-118n and the racks 102a-102n are illustrated as including sensors 140 and 142, respectively, alternative means for detecting the temperatures and/or the mass flow rates at these locations may be employed without departing from a scope of the system 202. For instance, the temperatures and/or the mass flow rates may be detected by hand with a handheld device and inputted into the controller 204. As another example, the temperatures and/or mass flow rates may be detected with an adequately equipped semi-autonomous mobile sensor device (not shown). More particularly, the semi-autonomous mobile sensor device may be configured to travel around the vent tiles 118a-118n and the racks 102a-102n to detect the temperatures and/or mass flow rates of air at these locations and to communicate this information to the controller 204. In this regard, the semi-autonomous mobile sensor device may function to gather environmental condition information while requiring substantially fewer sensors in the data center 100. A more detailed description of the semi-autonomous mobile sensor device and its operability may be found in co-pending and commonly assigned U.S. application Ser. No. 10/157,892, filed on May 31, 2002, the disclosure of which is hereby incorporated by reference in its entirety.

In any regard, the data received by the controller 204 via the input/output module 206 may be stored in a memory 212. The memory 212 may also generally be configured to provide storage of software that provides the functionality of the controller 204. In one regard, the memory 212 may be implemented as a combination of volatile and non-volatile memory, such as DRAM, EEPROM, flash memory, and the like.

The data stored in the memory 212 may be accessed by a VTI/VTO module 214. In addition, the memory 212 may comprise software or algorithms that the VTI/VTO module 214 may implement in calculating the VTI/VTO. Although the VTI/VTO module 214 has been shown in FIG. 2A as forming part of the controller 204, the functionality of the VTI/VTO module 214 may instead form part of the memory 212 without departing from a scope of the system 202.

In general, the VTI/VTO module 214 operates to calculate either or both of the VTI and the VTO for one or more racks 102a-102n. In other words, the VTI/VTO calculation module 214 is configured to determine how changes in flow rates of airflow through various vent tiles 118a-118n affect characteristics of airflow through various racks 102a-102n in determining VTI. Alternatively, the VTI/VTO calculation module 214 is configured to determine how changes in the operations of various vent tiles 118a-118n affect the temperatures of airflow delivered into the various racks 102a-102n in determining VTO.

Manners in which the VTI may be determined may be found in the co-pending and commonly assigned U.S. patent application Ser. No. 10/960,573. In addition, manners in which the VTO may be determined may be found in the co-pending and commonly assigned U.S. patent application Ser. No. 10/960,574.

As described in those applications, prior knowledge of rack 102a-102n and vent tile 118a-118n locations may be beneficial since this may reduce the number of VTIs/VTOs calculated and the unknowns in the system of equations described above. However, in order to obtain the most accurate correlations between the racks 102a-102n and the vent tiles 118a-118n, the VTIs/VTOs may be calculated for all possible rack 102a-102n and vent tile 118a-118n combinations.

According to an example, the VTIs/VTOs for some of the vent tiles 118a-118n may be determined through approximation. In this example, a model may be created a priori to determine which of the vent tiles 118a-118n most affect a particular rack 102a-102n and to determine the VTIs/VTOs for vent tiles 118a-118n that have relatively less effect on the particular rack 102a-102n by approximation. The approximated VTIs/VTOs for the vent tiles 118a-118n may be based, for instance, upon their distances from the particular rack 102a-102n. Thus, those vent tiles 118a-118n that are closer to the particular rack 102a-102n may have higher approximated VTIs/VTOs than those vent tiles 118a-118n that are farther from the particular rack 102a-102n. In this regard, the VTIs/VTOs for all of the possible rack 102a-102n and vent tile 118a-118n combinations may not need to be determined, thus reducing the amount of time required to determine all of the VTIs.

In determining the VTIs and/or the VTOs of the racks 102a-102n, the controller 204 may operate respective actuators 220 configured to vary a characteristic of airflow through the vent tiles 118a-118n, as described in the above-identified U.S. Patent Applications. The vent tile actuators 220 may comprise actuators configured to vary the airflows through the vent tiles 118a-118n. Examples of suitable vent tile actuators 220 and vent tiles 118a-118n configured to vary the cooling fluid flow therethrough may be found in commonly assigned U.S. Pat. No. 6,694,759, entitled "Pressure Control of Cooling Fluid Within a Plenum Using Automatically Adjustable Vents", filed on Jan. 27, 2003, the disclosure of which is hereby incorporated by reference in its entirety. A discussion of various operational modes for these types of vents is disclosed in U.S. Pat. No. 6,574,104, which is also commonly assigned and hereby incorporated by reference in its entirety. In addition, the vent tile actuators 220 may comprise the motors 156 of the fan assemblies 152 depicted in FIG. 1C. Thus, for instance, the mass flow rates of airflow supplied through the vent tiles 118a-118n may be varied through varying of the motor 156 operations.

In certain instances, the airflow supplied into the racks 102a-102n includes airflow that has not been directly supplied through one or more of the vent tiles 118a-118n. Instead, some of the airflow may include airflow that has been re-circulated into the supply airflow. This airflow may include, for instance, airflow that has been heated in one of more of the racks 102a-102n and exhausted into the data center 100. As this re-circulated airflow may affect the temperature of the airflow supplied to the racks 102a-102n, this airflow may be considered in determining VTI/VTO as described in the above-identified co-pending U.S. Patent Applications.

The controller 204 also includes a VTF module 216. Although the VTF module 216 has been shown in FIG. 2A as forming part of the controller 204, the functionality of the VTF module 216 may instead form part of the memory 212 without departing from a scope of the system 202. The VTF module 216 is generally configured to determine which of the vent tiles 118a-118n have at least a predetermined minimum level of influence over particular racks 102a-102n and may classify these vent tiles 118a-118n into vent tile families (VTFs). Thus, for instance, the VTF module 216 may determine the VTFs for each of the racks 102a-102n.

The controller 204 further includes a VCF module 218 configured to determine subsets of vent tiles 118a-118n in respective VTF's whose associated racks 102a-102n are receiving cool air at flow rates outside of prescribed ranges (minimum and maximum flow rates). Alternatively, the VCF module 218 may determine subsets of vent tiles 118a-118n in respective VTFs whose associated racks 102a-102n have inlet temperatures that are outside of prescribed ranges (minimum and maximum flow rates). In any regard, the vent tiles 118a-118n in the subsets are considered as being in respective vent control families (VCFs). Although the VCF module 218 has been shown in FIG. 2A as forming part of the controller 204, the functionality of the VCF module 216 may instead form part of the memory 212 without departing from a scope of the system 202.

The racks 102a-102n may comprise some or all of the racks 102-108 shown and described with respect to FIG. 1A. In addition, the vent tiles 118a-118n may comprise some or all of the vent tiles 118 shown and described in FIGS. 1A-1C. References to the racks 102a-102n and the vent tiles 118a-118n are not intended to limit the system 202 in any respect, but are made to simplify the illustration and description of these elements.

As described in the co-pending applications identified above, re-circulation of heated airflow supplied into the racks 102a-102n may be factored in determining VTI or VTO. In this regard, the controller 204 may optionally comprise an SHI calculation module 230. The SHI or supply heat index calculation module 230 is generally configured to calculate SHI as described in greater detail in U.S. patent application Ser. No. 10/960,573 and U.S. patent application Ser. No. 10/960,574.

Although the controller 204 is illustrated as receiving sensed information from a plurality of racks 102a-102n and as controlling a plurality of vent tiles 118a-118n, the controller 204 may receive sensed information from a single rack, for instance, rack 102a. In addition, the controller 204 may control one or more vent tiles 118a-118n in a VCF of the rack. In another example, the controller 204 may receive sensed information from a first plurality of racks and may control the vent tiles 118a-118n according to the VCFs to which they belong. In a further example, the controller 204 may receive sensed information from a second plurality of racks, which include a larger number of racks than the first plurality and may control the vent tiles 118a-118n according to the VCFs to which they are associated. Control over the vent tiles 118a-118n may be performed in a hierarchical manner as described in greater detail hereinbelow with respect to FIG. 2B.

Figure 2B:
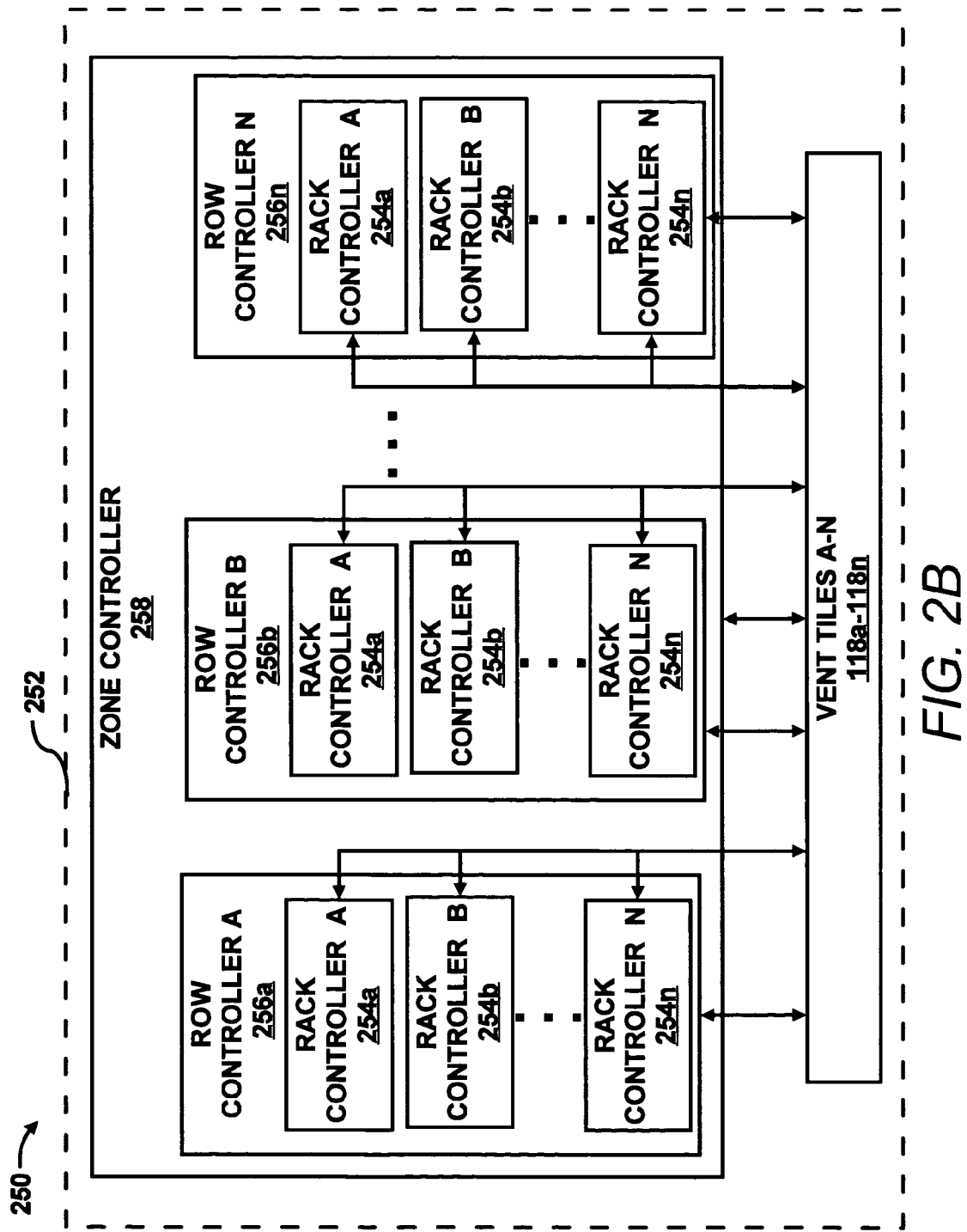
FIG. 2B is block diagram of a hierarchical vent tile control system according to an embodiment of the invention.

In FIG. 2B, there is shown a block diagram 250 of a hierarchical vent tile control system 252. It should be understood that the following description of the block diagram 250 is but one manner of a variety of different manners in which such a system 252 may be operated. In addition, it should be understood that the system 252 may include additional components and that some of the components described may be removed and/or modified without departing from a scope of the system 252. Thus, for instance, although three tiers of VTFs have been illustrated in FIG. 2B, any reasonably suitable number of VTF tiers may be included in the hierarchical vent tile control system 252.

The hierarchical vent tile control system 252 generally operates to create and operate dynamic groups of vent tiles 118a-118n that respond to thermal management demands of closely-knit hierarchical rack 102a-102n formations. The lowest tier of the hierarchical rack 102a-102n formations is considered herein as a rack vent tile family (VTF). The rack VTF may include those vent tiles 118a-118n that are within a VTF of a particular rack 102a and may be determined in the manners described hereinabove. The vent tiles 118a-118n in the rack VTF may be controlled by a rack controller 254a-254n. A second tier of the hierarchical rack 102a-102n formations is considered herein as a row VTF. The row VTF may include those vent tiles 118a-118n having a predetermined minimum level of influence over a particular set of racks 102a-102n. The vent tiles 118a-118n in the row VTF may be controlled by a rack controller 256a-256n. A third tier of the hierarchical rack 102a-102n formations is considered herein as a zone VTF. The zone VTF may include those vent tiles 118a-118n having a predetermined minimum level of influence over a larger set of racks 102a-102n as compared with the vent tiles 118a-118n contained in a row VTF. The vent tiles 118a-118n in the zone VTF may be controlled by a zone controller 258.

As shown in the hierarchical vent tile control system 252, a plurality of rack controllers 254a-254n are illustrated as being located within respective row controllers 256a-256n. In addition, the row controllers 256a-256n are illustrated as being located within a zone controller 258. The depiction of the rack controllers 254a-254n being located within the respective row controllers 256a-256n is to signify that the vent tiles 118a-118n in the rack VTFs of the rack controllers 254a-254n in an area of a particular row controller 256a, for instance, may be within a row VTF that row controller 256a. In addition, the depiction of the row controllers 256a-256n being located within the zone controller 258 is to signify that the vent tiles 118a-118n in the row VTFs of the row controllers 256a-256n in an area of a particular zone controller 258, for instance, may be within a zone VTF of that zone controller 258.

The controllers 254-258 may be defined as software and/or hardware configured to create and operate dynamic groups of vent tiles 118a-118n in response to thermal management demands of hierarchical rack 102a-102n formations. In this regard, each of the controllers 254-258 may have the same configuration as the controller 204 shown in FIG. 2A. In addition, based upon various criteria defined hereinbelow, the controllers 256-258 may operate to release control over particular ones of the vent tiles 118a-118n in their VTFs.

More particularly, the rack controllers 254 may release control over those vent tiles 118a-118n that are not in the VCFs of any of the rack controllers 254 to the row controllers. In addition, the row controllers 256 may release control over those vent tiles 118a-118n that are not in the VCFs of any of the row controllers 256 to the zone controller 258.

In the hierarchical vent tile control system 252 illustrated in FIG. 2B, the rack controllers 254a-254n have the greatest level of control over the vent tiles 118a-118n to enable greater control over localized areas in the data center 100. As described above, neither the row controller 256a-256n nor the zone controller 258 has control over the vent tiles 118a-118n unless the vent tiles 118a-118n have been released by the rack controllers 254a-254n. An operational mode based upon a hierarchical vent tile control structure depicted in FIG. 2B is described in greater detail hereinbelow with respect to FIG. 5.

Figure 3:
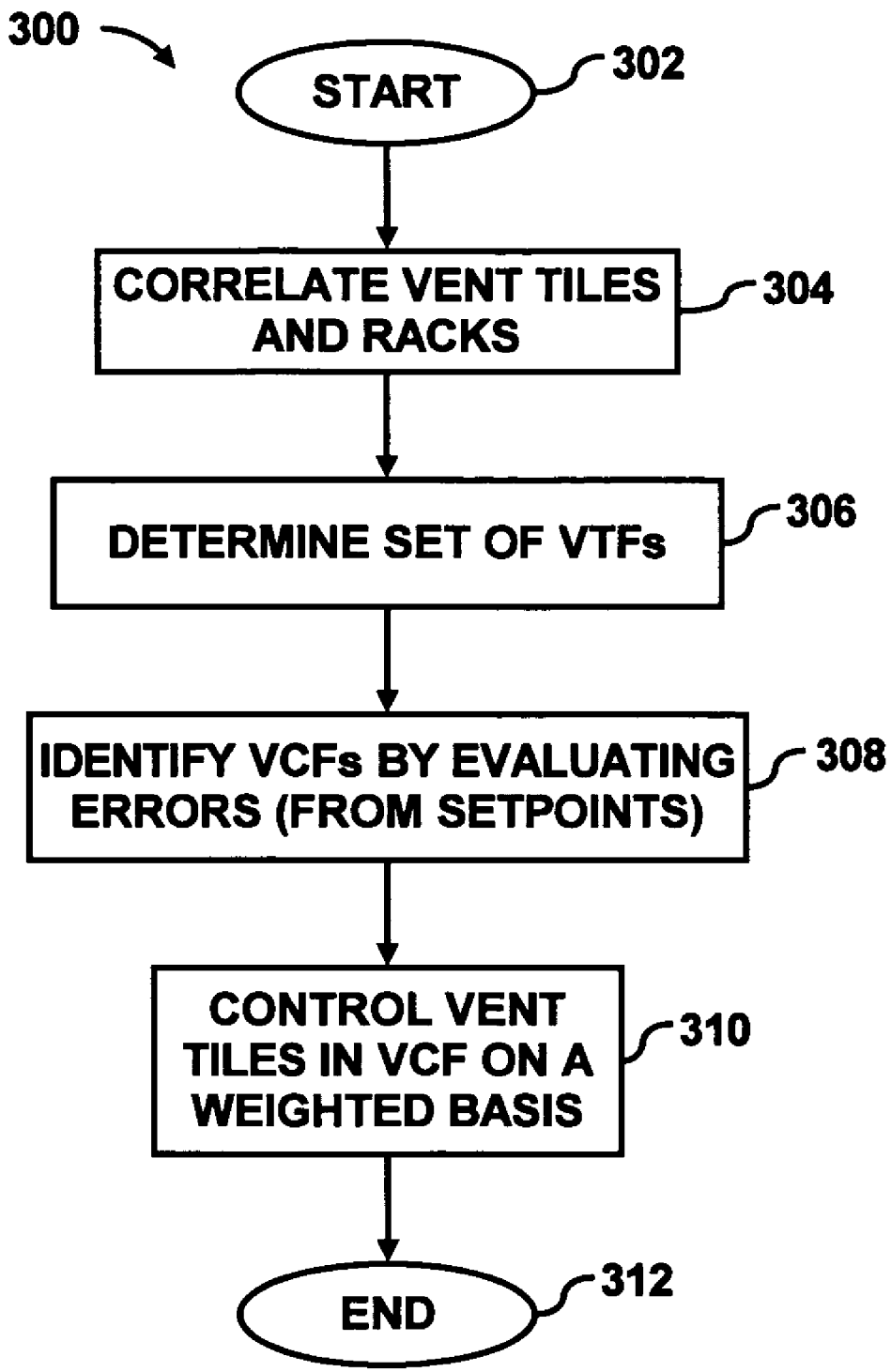
FIG. 3 illustrates a flow diagram of an operational mode for controlling vent tiles, according to an embodiment of the invention.

FIG. 3 illustrates a flow diagram of an operational mode 300 for controlling vent tiles. It is to be understood that the following description of the operational mode 300 is but one manner of a variety of different manners in which the vent tiles 118a-118n could be controlled. It should also be apparent to those of ordinary skill in the art that the operational mode 300 represents a generalized illustration and that other steps may be added or existing steps may be removed or modified without departing from the scope of the operational mode 300. The description of the operational mode 300 is made with reference to the block diagram 200 illustrated in FIG. 2A, and thus makes reference to the elements cited therein.

The operational mode 300 generally operates as an algorithm to manipulate vent tiles 118a-118n that are positively correlated to any given rack 102a-102n based upon the measured or estimated airflow rate through each of the racks 102a-102n. Vent tiles 118a-118n are considered to be positively correlated with a given rack 102a-102n if those vent tiles 118a-118n influence the given rack 102a-102n at levels above a predefined minimum threshold. The vent tiles 118a-118n that are considered as being positively correlated with a given rack 102a, for instance, are considered as being in that rack's 102a vent tile family (VTF). A goal of the operational mode 400 is to generally ensure that a specified minimum amount of air flow is provided to each rack 102a-102n from the vent tiles 118a-118n. In one example, the specified minimum amount of air flow is at least 100% of the measured or estimated flow rates at the inlets of the racks 102a-102n.

The operational mode 300 may be initiated in response to a variety of stimuli at step 302. For example, the operational mode 300 may be initiated in response to a predetermined lapse of time, in response to receipt of a transmitted signal, manually initiated, etc. At step 304, the vent tiles 118a-118n may be correlated with the racks 102a-102n. In a first example, the correlation between the vent tiles 118a-118n may be made in accordance with any of the manners described in the co-pending U.S. patent application Ser. No. 10/960,573 entitled "Correlation of Vent Tiles and Racks". An operational mode 400 based upon the vent tile influence coefficient (VTI) described in that Application is described hereinbelow with respect to FIG. 4A.

In a second example, the correlation between the vent tiles 118a-118n may be made in accordance with any of the manners described in the co-pending U.S. patent application Ser. No. 10/960,574 entitled "Correlation of Vent Tile Settings and Rack Temperatures". An operational mode 450 based upon the vent tile opening index (VTO) described in that Application is described hereinbelow with respect to FIG. 4B.

In any regard, at step 306, vent tile families (VTFs) for each of the racks 102a-102n is determined. The VTFs are formed by grouping vent tiles 118a-118n together that influence particular racks 102a-102n above a predefined threshold. The predefined threshold may be set, for instance, according to the level of control desired over the airflow delivered to the individual racks 102a-102n. Thus, the predefined threshold may be set to a low level, for instance, between around 25-50% to include a relatively large number of vent tiles 118a-118n in the VTFs over which a controller 204 may have control. On the other hand, the predefined threshold may be set to a relatively high level, for instance, between around 50-80% to reduce the number of vent tiles 118a-118n in the VTFs while ensuring that the vent tiles 118a-118n in the VTFs have relatively high influence over the airflow delivered into the racks 102a-102n. In addition, the vent tiles 118a-118n may be included in more than one VTF. Thus, for instance, rack 102a may have vent tiles 118a-118c in its VTF, while rack 102b may be have vent tiles 118c-118h in its VTF.

At step 308, the set of vent control families (VCFs) for each of the VTFs may be identified. As described above, VCFs are the subsets of the VTFs whose associated racks 102a-102n are receiving cool air outside of a prescribed range (minimum and maximum flow rates). In other words, the VCFs may be defined as the set of actuators (vent tiles 118a-118n) that are used to modulate cool airflow into the racks 102a-102n that are receiving cool air outside of the prescribed range. If a vent tile 118a-118n belongs to a plurality of VTFs, each associated with a rack 102a-102n operating outside of its prescribed range, the VCF may be in the VTF serving the rack 102a-102n that deviates furthest from the prescribed range. Alternatively, in the event that each rack 102a-102n is operating on opposite ends of the prescribed range, the VCF may be considered as the one violating the minimum flow rate range or maximum temperature.

At step 310, the vent tiles 118a-118n in the VCFs may be controlled on a weighted basis determined by the correlation between the vent tiles 118a-118n and the racks 102a-102n performed at step 304. Manners in which the vent tiles 118a-118n in the VCFs may be controlled are described in greater detail hereinbelow with respect to the operational modes 400 and 450.

Following control of the vent tiles 118a-118n at step 310, the operational mode 300 may end as indicated at step 312. However, the control over the vent tiles 118a-118n at step 310 may be repeated in a substantially continuous manner as conditions in the data center 100 vary. In addition, the operational mode 300 may end following a predetermined period of time, following a predetermined number of iterations, following a manual instruction to discontinue, etc.

Figure 4A:
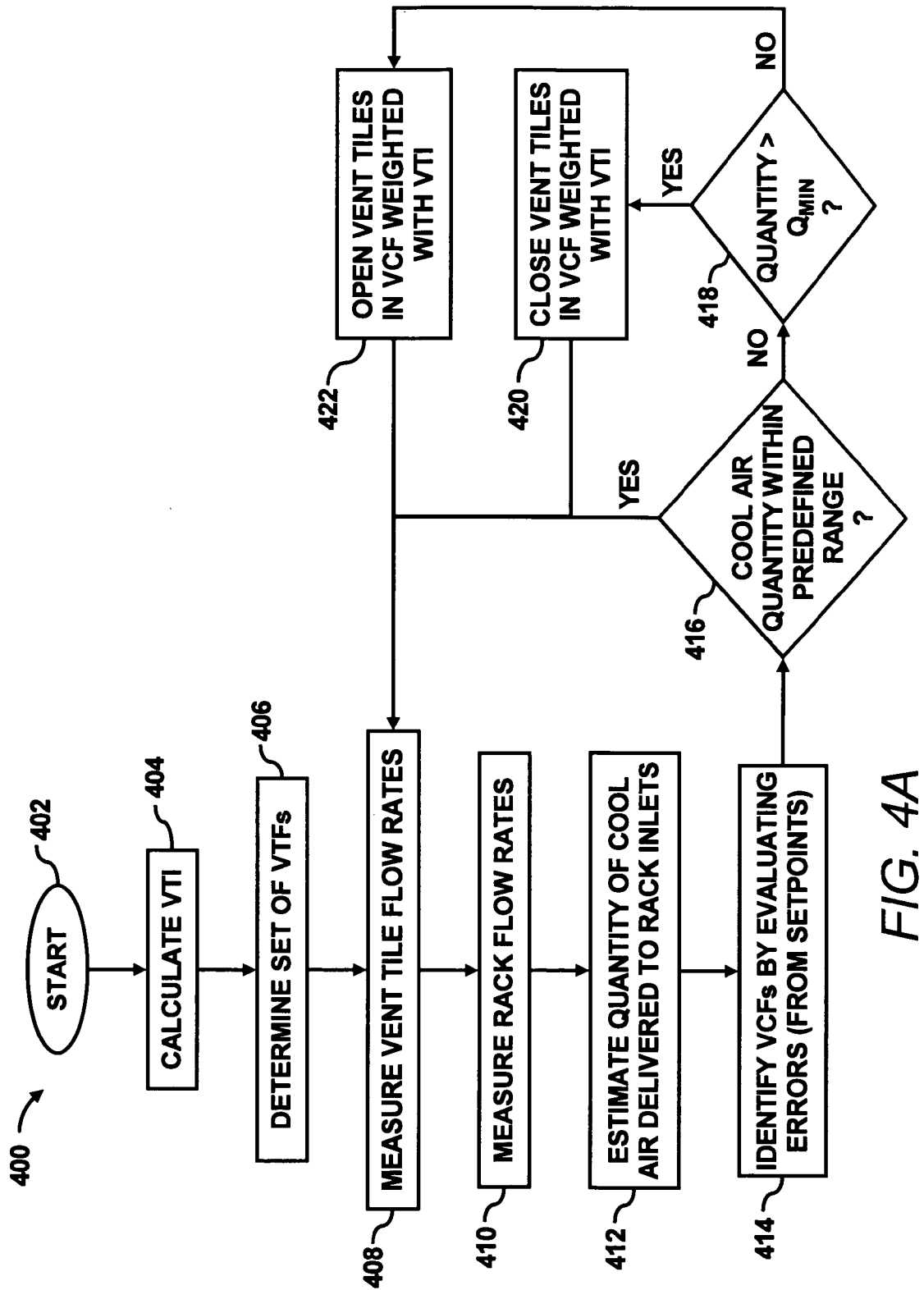
FIG. 4A illustrates a flow diagram of an operational mode for controlling vent tiles according to a first example of the operational mode illustrated in FIG. 3.
Figure 4B:
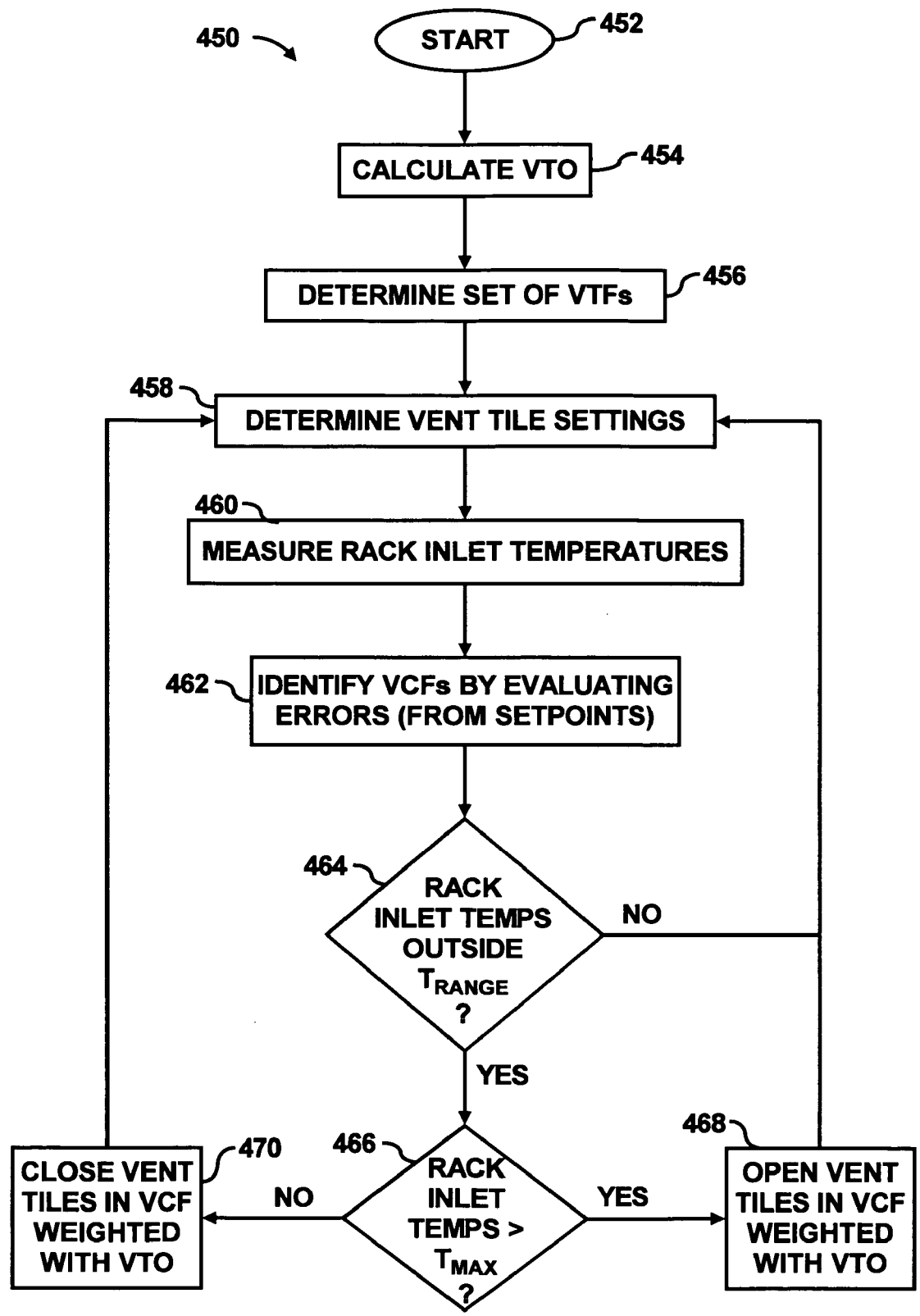
FIG. 4B illustrates a flow diagram of an operational mode for controlling vent tiles according to a second example of the operational mode illustrated in FIG. 3.

Reference is now made to FIGS. 4A and 4B, which illustrate respective operational modes 400 and 450 for controlling vent tiles 118a-118n based upon whether control over the vent tiles 118a-118n depends upon airflow rate or temperature through the inlets of the racks 102a-102n. With reference first to FIG. 4A, there is shown a flow diagram of an operational mode 400 for controlling vent tiles according to a first example of the operational mode 300. It is to be understood that the following description of the operational mode 400 is but one manner of a variety of different manners in which the vent tiles 118a-118n could be controlled. It should also be apparent to those of ordinary skill in the art that the operational mode 400 represents a generalized illustration and that other steps may be added or existing steps may be removed or modified without departing from the scope of the operational mode 400. The description of the operational mode 400 is made with reference to the block diagram 200 illustrated in FIG. 2A, and thus makes reference to the elements cited therein.

The operational mode 400 may be initiated in response to a variety of stimuli at step 402. For example, the operational mode 400 may be initiated in response to a predetermined lapse of time, in response to receipt of a transmitted signal, manually initiated, etc. At step 404, the VTI matrix may be calculated in accordance with any of the manners described in the co-pending U.S. patent application Ser. No. 10/960,573 entitled "Correlation of Vent Tiles and Racks". It should, however, be understood that step 404 may be omitted since the VTI matrix may have previously been determined. In addition, therefore, in place of calculating the VTI matrix, step 404 may be modified to state that the VTI matrix is accessed.

At step 406, the vent tile families (VTFs) of each of the racks 102a-102n is determined. The VTFs are formed by grouping vent tiles 118a-118n together that influence particular racks 102a-102n above a predefined threshold. The predefined threshold may be set, for instance, according to the level of control desired over the airflow delivered to the individual racks 102a-102n. Thus, the predefined threshold may be set to a low level, for instance, between around 25-50% to include a relatively large number of vent tiles 118a-118n in the VTFs over which a controller 204 may have control. On the other hand, the predefined threshold may be set to a relatively high level, for instance, between around 50-80% to reduce the number of vent tiles 118a-118n in the VTFs while ensuring that the vent tiles 118a-118n in the VTFs have relatively high influence over the airflow delivered into the racks 102a-102n. In addition, the vent tiles 118a-118n may be included in more than one VTF. Thus, for instance, rack 102a may have vent tiles 118a-118c in its VTF, while rack 102b may be have vent tiles 118c-118h in its VTF.

At step 408, the flow rates of air supplied through the vent tiles 118a-118n may be measured with the sensors 210. The sensors 210 may comprise any reasonably suitable flow rate sensors, such as, anemometers and the like. Alternatively, the flow rates of air supplied through the vent tiles 118a-118n may be estimated through detection of pressure drops across the vent tiles 118a-118n, vent tile fan 152 speeds, etc.

At step 410, the flow rates of air delivered to each of the racks 102a-102n may be measured through use of flow rate sensors 210. Alternatively, the flow rates of airflow may be estimated through various other means. For instance, the flow rates of the airflow may be estimated through use of temperature drop detection along with power draw detection, pressure differences, component 116 fan speeds, etc. By way of example, a rack flow rate determination may be made by measuring the temperature difference ($\Delta T$) between airflow at the inlet of the rack and at the outlet of the rack and measuring the power either directly or inferring power with workload or the state of the components 116 contained in the rack. In other words, the caloric equation may be simplified to the following relationship (at sea level) to determine the volume flow rate through the rack in CFM:

$$V = \frac{1.8(Q)}{\Delta T}, \quad \text{Equation (3)}$$

where V is the calculated volume flow in CFM, Q is the measured power in Watts, and $\Delta T$ is the temperature difference across the rack measured in ° C.

At step 412, the quantity of cool air delivered into the inlets of the racks 102a-102n may be estimated. As described in greater detail in the co-pending U.S. patent application Ser. Nos. 10/960,573, entitled "Correlation of Vent Tiles and Racks", the airflow delivered into the racks 102a-102n may comprise a mixture of cool air supplied directly from the vent tiles 118a-118n and re-circulated airflow. The re-circulated airflow may have been heated in the racks 102a-102n and may thus be at a higher temperature than the cool airflow supplied directly from the vent tiles 118a-118n. The level of the re-circulated airflow infiltrating into the airflow delivered into the racks 102a-102n as well as the cool air delivered into the racks 102a-102n may be calculated in any of the manners described in the Patent Application identified above.

At step 414, the set of vent control families (VCFs) for each of the VTFs may be identified. As described above, VCFs are the subsets of the VTFs whose associated racks 102a-102n are receiving cool air outside of a prescribed range (minimum and maximum flow rates). If a vent tile 118a-118n belongs to a plurality of VTFs, each associated with a rack 102a-102n operating outside of its prescribed range, the VCF may be in the VTF serving the rack 102a-102n that deviates furthest from the prescribed range. Alternatively, in the event that each rack 102a-102n is operating on opposite ends of the prescribed range, the VCF may be considered as the one violating the minimum flow rate range.

At step 416, for each of the vent tiles 118a-118n in the VCFs, it may be determined whether the quantities of cool air delivered into their associated racks 102a-102n are within a predefined quantity range. The predefined range may be defined as a range of cool airflow quantities that meet operating requirements for the components 116 contained in the racks 102a-102n. The predefined range is bounded by a minimum quantity level ($Q_{MIN}$) and a maximum quantity level ($Q_{MAX}$).

If the cool air quantity is within the predefined range at step 416, the vent tile 118a-118n flow rates may be measured again at step 408 and steps 410-416 may be repeated substantially continuously. In this regard, the cool air quantities supplied to the rack 102a-102n inlets may be monitored in a substantially continuous manner. The cool air quantities may be monitored until it is determined that the cool air quantities are no longer within the predefined range at step 416. In this instance, it may be determined whether the cool air quantities fall below the minimum quantity level ($Q_{MIN}$) at step 418. The determination of whether the quantities of cool airflow supplied into the racks 102a-102n fall below minimum quantity level may be made in various manners. For instance, if the level of re-circulation or SHI is known, the quantities of cool airflow supplied into the racks 102a-102n may be estimated. Alternatively, the quantities of cool airflow supplied into the racks 102a-102n may be determined through knowledge of the temperature and flow rate of the airflow supplied through the vent tiles 118a-118n and the temperature and flow rate of the airflow delivered into the racks 102a-102n.

For each of the vent tiles 118a-118n in the VCFs, if it is determined that the cool airflow quantity exceeds the minimum quantity level at step 418, which also indicates that the cool airflow quantity exceeds the maximum quantity level, the cool airflow, the vent tiles 118a-118n may be closed according to a weighting based upon VTI, as indicated at step 420. In addition, for each of the vent tiles 118a-118n in the VCFs, if it is determined that the flow is insufficient, or falls below the minimum quantity level at step 418, the vent tiles 118a-118n in the VCFs may be opened according to a weighting based upon VTI, as indicated at step 422. Thus, the levels to which the vent tiles 118a-118n are closed at step 420 or opened at step 422 may be based upon the level of influence the vent tiles 118a-118n have over the racks 102a-102n. By way of example, if a vent tile 118a within a VCF influences a particular rack 50% more than vent tile 118b in the same VCF, the vent tile 118a will be more heavily weighted than the vent tile 118b.

Steps 420 and 422 may performed based upon an iterative process. By way of example, the VCFs may be used to identify the vent tiles 118a-118n in various families and Equation (1) may be used to estimate the current amount of airflow and the airflow that will occur for a given adjustment of tiles. Based upon these considerations, the changes to the vent tiles 118a-118n at step 420 and 422 may be made and this process may be iterated as necessary to achieve the desired cool airflow quantities through the racks 102a-102n.

In controlling the vent tiles 118a-118n at steps 420 and 422, for instance, the vent tile openings may be considered as "set points" defined as a percentage that the vent tiles 118a-118n are open. A proportional, integral, derivative (PID) control system may be employed to adjust the set points. Alternatively, a more direct control algorithm, such as, a proportional or incremental control algorithm, with feedback, may be employed to adjust the set point.

In addition, because the vent tiles 118a-118n may comprise any reasonably suitable type of adjustable vent tile, the "opening" and "closing" operations are meant to be generic. Thus, "opening" of a vent tile 118a-118n may signify increasing fan speed on a vent tile 118a-118n configured with a fan assembly 152 as shown in FIG. 1C. In this regard, a set point may imply either opening the vent tile 118a-118n or increasing flow through the vent tile 118a-118n through use of an active fan 154. Therefore, the set point may include one or both of the vent tile 118a-118n opening and the fan 154 speed setting.

Following either of steps 420 and 422, steps 408-422 may be repeated and the operational mode 450 may be run for a predefined period of time, until it is manually discontinued, etc.

FIG. 4B illustrates a flow diagram of an operational mode 450 for controlling vent tiles according to a second embodiment. It is to be understood that the following description of the operational mode 450 is but one manner of a variety of different manners in which the vent tiles 118a-118n could be controlled. It should also be apparent to those of ordinary skill in the art that the operational mode 450 represents a generalized illustration and that other steps may be added or existing steps may be removed or modified without departing from the scope of the operational mode 450. The description of the operational mode 450 is made with reference to the block diagram 200 illustrated in FIG. 2A, and thus makes reference to the elements cited therein.

The operational mode 450 generally operates as an algorithm to manipulate vent tiles 118a-118n that are positively correlated to any given rack 102a-102n based upon the measured inlet temperatures of the racks 102a-102n. Vent tiles 118a-118n are considered to be positively correlated with a given rack 102a-102n if those vent tiles 118a-118n influence the given rack 102a-102n at levels above a predefined minimum threshold. The vent tiles 118a-118n that are considered as being positively correlated with a given rack 102a, for instance, are considered as being in that rack's 102a vent tile family (VTF). A goal of the operational mode 450 is to generally ensure that the airflow supplied into the racks 102a-102n is at a specified minimum temperature. In one example, the specified minimum temperature may be based upon a minimum safe operating temperature set forth by the component 116 manufacturers.

The operational mode 450 may be initiated in response to a variety of stimuli at step 452. For example, the operational mode 450 may be initiated in response to a predetermined lapse of time, in response to receipt of a transmitted signal, manually initiated, etc. At step 454, the VTO matrix may be calculated in accordance with any of the manners described in the co-pending U.S. patent application Ser. No. 10/960,574 entitled "Correlation of Vent Tile Settings and Rack Temperatures". It should, however, be understood that step 454 may be omitted since the VTO matrix may have previously been determined. In addition, therefore, in place of calculating the VTO matrix, step 454 may be modified to state that the VTO matrix is accessed.

At step 456, the vent tile families (VTFs) of each of the racks 102a-102n is determined. The VTFs are formed by grouping vent tiles 118a-118n together that influence particular racks 102a-102n above a predefined threshold. The predefined threshold may be set, for instance, according to the level of control desired over the airflow delivered to the individual racks 102a-102n. Thus, the predefined threshold may be set to a low level, for instance, between around 25-50% to include a relatively large number of vent tiles 118a-118n in the VTFs over which a controller 204 may have control. On the other hand, the predefined threshold may be set to a relatively high level, for instance, between around 50-80% to reduce the number of vent tiles 118a-118n in the VTFs while ensuring that the vent tiles 118a-118n in the VTFs have relatively high influence over the airflow delivered into the racks 102a-102n. In addition, the vent tiles 118a-118n may be included in more than one VTF. Thus, for instance, rack 102a may have vent tiles 118a-118c in its VTF, while rack 102b may be have vent tiles 118c-118h in its VTF.

At step 458, the vent tile 118a-118n settings may be determined. The vent tile 118a-118n settings may include the percentages to which the vent tiles 118a-118n are open or the speeds of the fans 154. The vent tile 118a-118n settings may be determined visually or through a sensor 140, such as, an encoder configured to detect positions of movable vanes on the vent tiles 118a-118n or the speed of the motor 156 turning the fan 154. Alternatively, the openings of the vent tiles 118a-118n may be estimated using proximity sensors or limit switches.

At step 460, the temperatures of the airflow supplied into the inlets of the racks 102a-102n may be measured. The inlet temperatures of the racks 102a-102n may be detected by temperature sensors 208.

At step 462, the set of vent control families (VCFs) for each of the VTFs may be identified. As described above, when VTO is used, VCFs are the subsets of the VTFs whose associated racks 102a-102n have inlet temperatures outside a prescribed range (minimum and maximum temperatures). If a vent tile 118a-118n belongs to a plurality of VTFs, each associated with a rack 102a-102n operating outside of its prescribed range, the VCF may be in the VTF serving the rack 102a-102n that deviates furthest from the prescribed range. Alternatively, in the event that each rack 102a-102n is operating on opposite ends of the prescribed range, the VCF may be considered as the one violating the maximum inlet temperature range.

At step 464, for each of the vent tiles 118a-118n in the VCFs, it may be determined whether their associated racks 102a-102n have inlet temperatures that are outside of a predefined temperature range ($T_{RANGE}$). The predefined temperature range may be defined as a range of safe operating temperatures for the components 116 housed in the racks 102a-102n. In addition, the predefined temperature range may be bounded by a predefined minimum temperature level and a predetermined maximum temperature level ($T_{MAX}$). The predefined minimum temperature level may be defined, for instance, as a minimum threshold temperature to substantially maintain conditions in the data center within comfortable levels. The predefined maximum temperature level may be defined, for instance, as the highest recommended temperature for the cooling airflow supplied to the components 116 in the racks 102a-102n.

If it is determined that all of the racks 102a-102n have inlet temperatures that are within the predefined temperature range at step 464, steps 458-464 may be repeated. However, for those racks 102a-102n have inlet temperatures that are outside of the predefined temperature range at step 464, it may be determined whether their inlet temperatures exceed the predefined maximum temperature level at step 466. For those racks 102a-102n having inlet temperatures that exceed the predefined minimum temperature level, the vent tiles 118a-118n in the VCFs of those racks 102a-102n may be opened according to a weighting based upon VTO, as indicated at step 468. In addition, for those racks 102a-102n having inlet temperatures that fall below the predefined maximum temperature level and outside of the predefined temperature range, the vent tiles 118a-118n in the VCFs of those racks 102a-102n may be closed according to a weighting based upon VTO, as indicated at step 470.

Thus, the levels to which the vent tiles 118a-118n are opened at step 468 or closed at step 470 may be based upon the level of influence the vent tiles 118a-118n have over the racks 102a-102n. By way of example, if a vent tile 118a within a VCF influences a particular rack 50% more than vent tile 118b in the same VCF, the vent tile 118a will be more heavily weighted than the vent tile 118b.

As with the operational mode 400, in controlling the vent tiles 118a-118n at steps 468 and 470, for instance, the vent tile openings may be considered as "set points" defined as a percentage that the vent tiles 118a-118n are open. A proportional, integral, derivative (PID) control system may be employed to adjust the set points. Alternatively, a more direct control algorithm, such as, a proportional or incremental control algorithm, with feedback, may be employed to adjust the set point.

In addition, because the vent tiles 118a-118n may comprise any reasonably suitable type of adjustable vent tile, the "opening" and "closing" operations are meant to be generic. Thus, "opening" of a vent tile 118a-118n may signify increasing fan speed on a vent tile 118a-118n configured with a fan assembly 152 as shown in FIG. 1C. In this regard, a set point may imply either opening the vent tile 118a-118n or increasing flow through the vent tile 118a-118n through use of an active fan 154. Therefore, the set point may include one or both of the vent tile 118a-118n opening and the fan 154 speed setting.

Following either of steps 470 and 472, steps 458-472 may be repeated and the operational mode 450 may be run for a predefined period of time, until it is manually discontinued, etc.

According to an example, the operational modes 400 and 450 may be performed by the individual rack controllers 254a-254n depicted in FIG. 2B. Thus, the operational modes 400 and 450 may be implemented to provide substantially localized, rack-level control over the vent tiles 118a-118n in the VCFs. The vent tiles 118a-118n that are not included in any of the VCFs are not actively controlled by the rack controllers 254a-254n to achieve their goals. That is, the rack controllers 254a-254n may achieve their goals without requiring that they control these vent tiles 118a-118n. Because these vent tiles 118a-118n may be used by row controllers 256a-256n and/or zone controllers 258 to achieve their goals, the rack controllers 254a-254n may enable the row controllers 256a-256n or the zone controllers 258 to control these vent tiles 118a-118n. A more detailed description of this type of hierarchical vent tile control arrangement is set forth hereinbelow with respect to FIG. 5.

Figure 5:
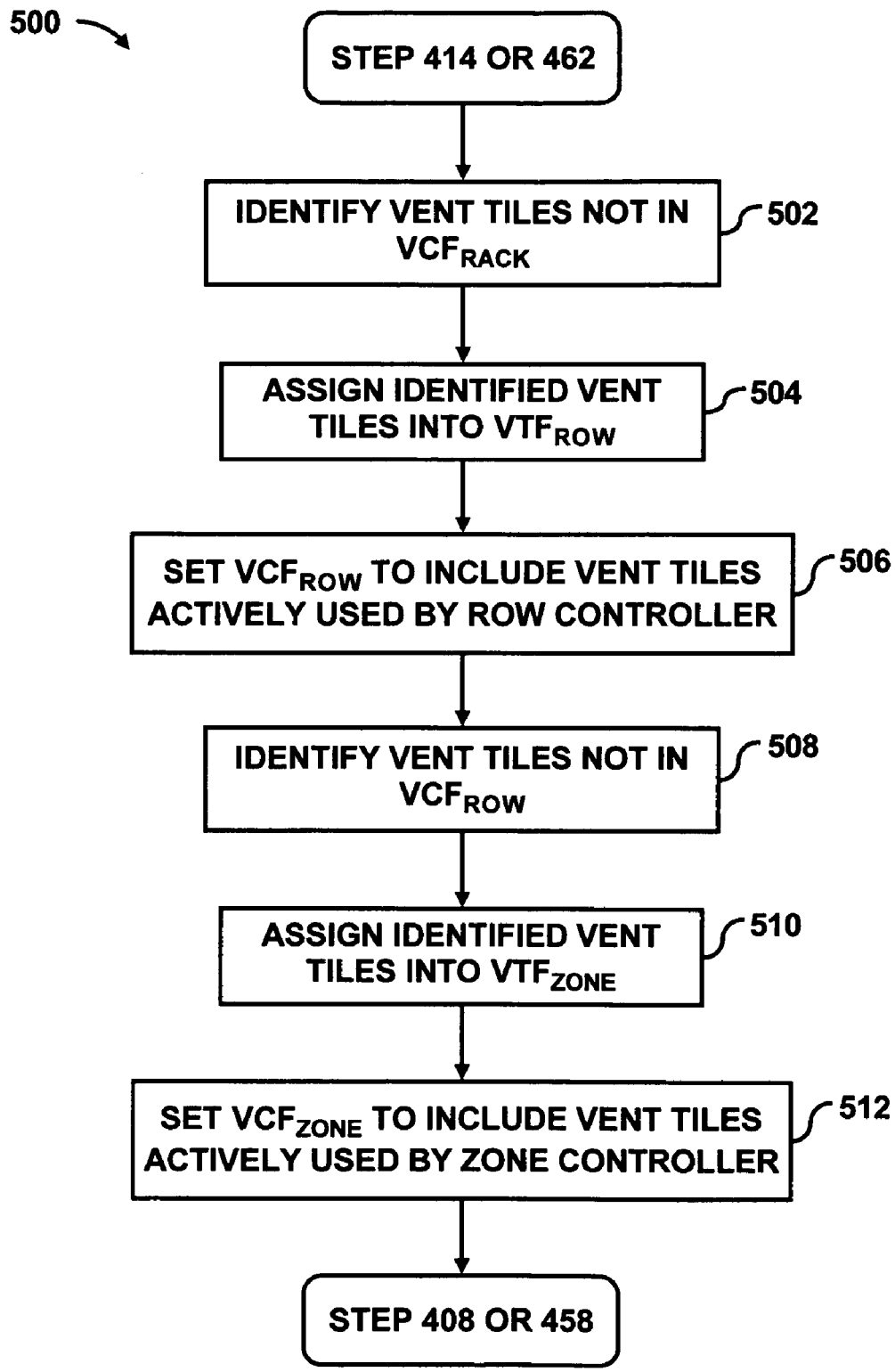
FIG. 5 illustrates a flow diagram of an operational mode for controlling vent tiles based upon a hierarchical vent tile control arrangement, according to an embodiment of the invention.

FIG. 5 illustrates a flow diagram of an operational mode 500 for controlling vent tiles based upon a hierarchical vent tile control arrangement. It is to be understood that the following description of the operational mode 500 is but one manner of a variety of different manners in which the vent tiles 118a-118n could be controlled. It should also be apparent to those of ordinary skill in the art that the operational mode 500 represents a generalized illustration and that other steps may be added or existing steps may be removed or modified without departing from the scope of the operational mode 500. The description of the operational mode 500 is made with reference to the block diagram 250 illustrated in FIG. 2B, and thus makes reference to the elements cited therein.

The operational mode 500 generally operates as an algorithm to identify and assign control over various vent tiles 118a-118n to generally enable control over the vent tiles 118a-118n in a hierarchical manner. Thus, for instance, control over those vent tiles 118a-118n that are not included in the VCFs for any of the racks 102a-102n may be handed over to a controller configured with larger scale goals in the data center 100. In one respect, the other controller may include those vent tiles 118a-118n into their VCFs and those vent tiles 118a-118n may be used by those other controllers in response to thermal management demands in the data center 100. Therefore, a goal of the operational mode 500 is to generally ensure that the vent tiles 118a-118n are being employed to their fullest extents while maintaining adequate local levels of control over the vent tiles 118a-118n.

As shown in FIG. 5, the operational mode 500 may be initiated following either step 414 from the operational mode 400 or step 462 from the operational mode 450. In addition, the operational mode 500 may be performed substantially concurrently with either of the operational modes 400 and 450 because the operational mode 500 generally utilizes vent tiles 118a-118n that are excluded from the VCFs determined at steps 414 and 462.

Once the VCFs of the racks 102a-102n ($VCF_{RACK}$) have been determined at step 414 or 462, the vent tiles 118a-118n that are excluded from the $VCF_{RACK}$ of all of the racks 102a-102n may be identified at step 502. A $VCF_{RACK}$ may be defined as the set of vent tiles 118a-118n that may be controlled by a rack controller 254a-254n as identified at steps 414 or 462. The vent tiles 118a-118n that have been identified at step 502 as not being included in any $VCF_{RACK}$, may be assigned to a particular $VTF_{ROW}$ at step 504. According to an example, the release of the vent tiles 118a-118n from a rack controller 254a-254n to a row controller 256a-256n may be withheld unless a given minimum threshold, for instance, an outer rack threshold, is achieved. For instance, a rack 102a may be receiving 950 CFM and the rack 102a needs 900 CFM for a rack 102a having a 50 CFM outer rack threshold. Thus, unless the rack 102a is receiving an adequate amount of airflow including the outer rack threshold amount, the rack controller 254a-254n for that rack 102a may not relinquish control over the vent tiles 118a-118n to the row controller 256a-256n.

The $VTF_{ROW}$ for a particular row comprises vent tiles 118a-118n that are in the family of vent tiles 118a-118n controllable by a row controller 256a-256n. The vent tiles 118a-118n may be assigned to a particular $VTF_{ROW}$ according to the location of the vent tiles 118a-118n and the rows of racks to which the respective row controllers 256a-256n are configured to control.

At step 506, a set of $VCF_{ROW}$ for each of the $VTF_{ROWS}$ may be identified. The sets of $VCF_{ROWS}$ are the subsets of the $VTF_{ROWS}$ whose associated rows of racks 102a-102n are receiving cool air outside of a prescribed range (minimum and maximum flow rates) or are the subsets of the $VTF_{ROWS}$ whose associated rows of racks 102a-102n have inlet temperatures outside a prescribed range (minimum and maximum temperatures). The prescribed ranges in the case of the row controllers 256a-256n may constitute a gross flow rate from respective $VTF_{ROWS}$ and may thus differ from the prescribed ranges described hereinabove for the VTFs for the racks 102a-102n. If a vent tile 118a-118n belongs to a plurality of $VTF_{ROWS}$, each associated with a row of racks 102a-102n operating outside of its prescribed range, the $VCF_{ROW}$ may be in the $VTF_{ROW}$ serving the row of racks 102a-102n that deviates furthest from the prescribed range. Alternatively, in the event that each row of racks 102a-102n is operating on opposite ends of the prescribed range, the $VCF_{ROW}$ may be considered as the one violating the minimum flow rate/maximum inlet temperature range.

Once the row controllers 256a-256n have set their respective $VCF_{ROWS}$, the row controllers 256a-256n may control the vent tiles 118a-118n in their respective $VCF_{ROWS}$ in manners similar to those set forth in the operational modes 400 and 450. For instance, if a row controller 256a determines that the gross flow rate through the vent tiles 118a-118n in its $VCF_{ROW}$ is insufficient, the row controller 256a may open the vent tiles 118a-118n according to weightings based upon VTI, as described hereinabove at step 422. Alternatively, however, the row controllers 256a-256n may control the vent tiles 118a-118n in their respective $VCF_{ROWS}$ based upon other criteria. These criteria may include, for instance, a desired average row temperature or flow rate according to the components 116 contained in that row. Thus, for instance, the row controllers 256a-256n may adjust the vent tiles 118a-118n in their respective $VCF_{ROWS}$ such that the desired average row temperature or flow rate is maintained.

In any regard, at step 508, the vent tiles 118a-118n that are excluded from the $VCF_{ROW}$ of all of the rows of racks 102a-102n may be identified. The vent tiles 118a-118n that have been identified at step 508 as not being included in any $VCF_{ROW}$, may be assigned to a particular $VTF_{ZONE}$ at step 510. According to an example, the release of the vent tiles 118a-118n from a row controller 256a-256n to a zone controller 258 may be withheld unless a given minimum threshold, for instance, an outer row threshold, is achieved. For instance, a row of racks 102a-102n may be receiving 10,000 CFM and the row of racks 102a-102n needs 9000 CFM for a row of racks 102a-102n having a 1000 CFM outer row threshold. Thus, unless the row of racks 102a-102n is receiving an adequate amount of airflow including the outer row threshold amount, the row controller 256a-256n for that row of racks 102a-102n may not relinquish control over the vent tiles 118a-118n to the zone controller 258.

The $VTF_{ZONE}$ for a particular zone comprises vent tiles 118a-118n that are in the family of vent tiles 118a-118n controllable by a zone controller 258. The vent tiles 118a-118n may be assigned to a particular $VTF_{ZONE}$ according to the location of the vent tiles 118a-118n and the zones to which the respective zone controllers 258 are configured to control.

At step 512, a set of $VCF_{ZONE}$ for each of the $VTF_{ZONES}$ may be identified. The sets of $VCF_{ZONES}$ are the subsets of the $VTF_{ZONES}$ whose associated zones of racks 102a-102n are receiving cool air outside of a prescribed range (minimum and maximum flow rates) or are the subsets of the $VTF_{ZONES}$ whose associated zones of racks 102a-102n have inlet temperatures outside a prescribed range (minimum and maximum temperatures). If a vent tile 118a-118n belongs to a plurality of $VTF_{ZONES}$, each associated with a zone of racks 102a-102n operating outside of its prescribed range, the $VCF_{ZONE}$ may be in the $VTF_{ZONE}$ serving the zone of racks 102a-102n that deviates furthest from the prescribed range. Alternatively, in the event that each zone of racks 102a-102n is operating on opposite ends of the prescribed range, the $VCF_{ZONE}$ may be considered as the one violating the minimum flow rate/maximum inlet temperature range.

Once the zone controllers 258 have set their respective $VCF_{ZONES}$, the zone controllers 258 may control the vent tiles 118a-118n in their respective $VCF_{ZONES}$ in manners similar to those set forth in the operational modes 400 and 450. For instance, if a zone controller 258 determines that the gross flow rate through the vent tiles 118a-118n in its $VCF_{ZONE}$ is insufficient, the zone controller 258 may open the vent tiles 118a-118n according to weightings based upon VTI, as described hereinabove at step 422. Alternatively, the zone controllers 258 may control the vent tiles 118a-118n in their respective $VCF_{ZONES}$ based upon CRAC unit 114 provisioning levels. For instance, the zone controllers 248 may control the vent tiles 118a-118n according to their relative proximities to the CRAC units 114. More particularly, vent tiles 118a-118n in closer proximity to a particular CRAC unit 114 generally have significant effects on the provisioning of that CRAC unit 114, and therefore, those vent tiles 118a-118n in closer proximity to the CRAC unit 114 may be more heavily weighted as they have greater influence over the CRAC unit 114 provisioning.

Following step 512, the operational mode 500 may revert back to either operational mode 400 or 450. Thus, as indicated in FIG. 5, the operational mode 500 may include performing step 408 or 458 following step 512. In addition, the operational mode 500 may be re-initiated following step 414 or 462. In this regard, the operational mode 500 may be repeated in substantially continuous manner to thus enable hierarchical control over the vent tiles 118a-118n by rack controllers 254a-254n, row controllers 256a-256n, and zone controllers 258.

The operations illustrated in the operational modes 300, 400, 450, and 500 may be contained as a utility, program, or a subprogram, in any desired computer accessible medium. In addition, the operational modes and 300, 400, 450, and 500 may be embodied by a computer program, which can exist in a variety of forms both active and inactive. For example, they can exist as software program(s) comprised of program instructions in source code, object code, executable code or other formats. Any of the above can be embodied on a computer readable medium, which includes storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 6:
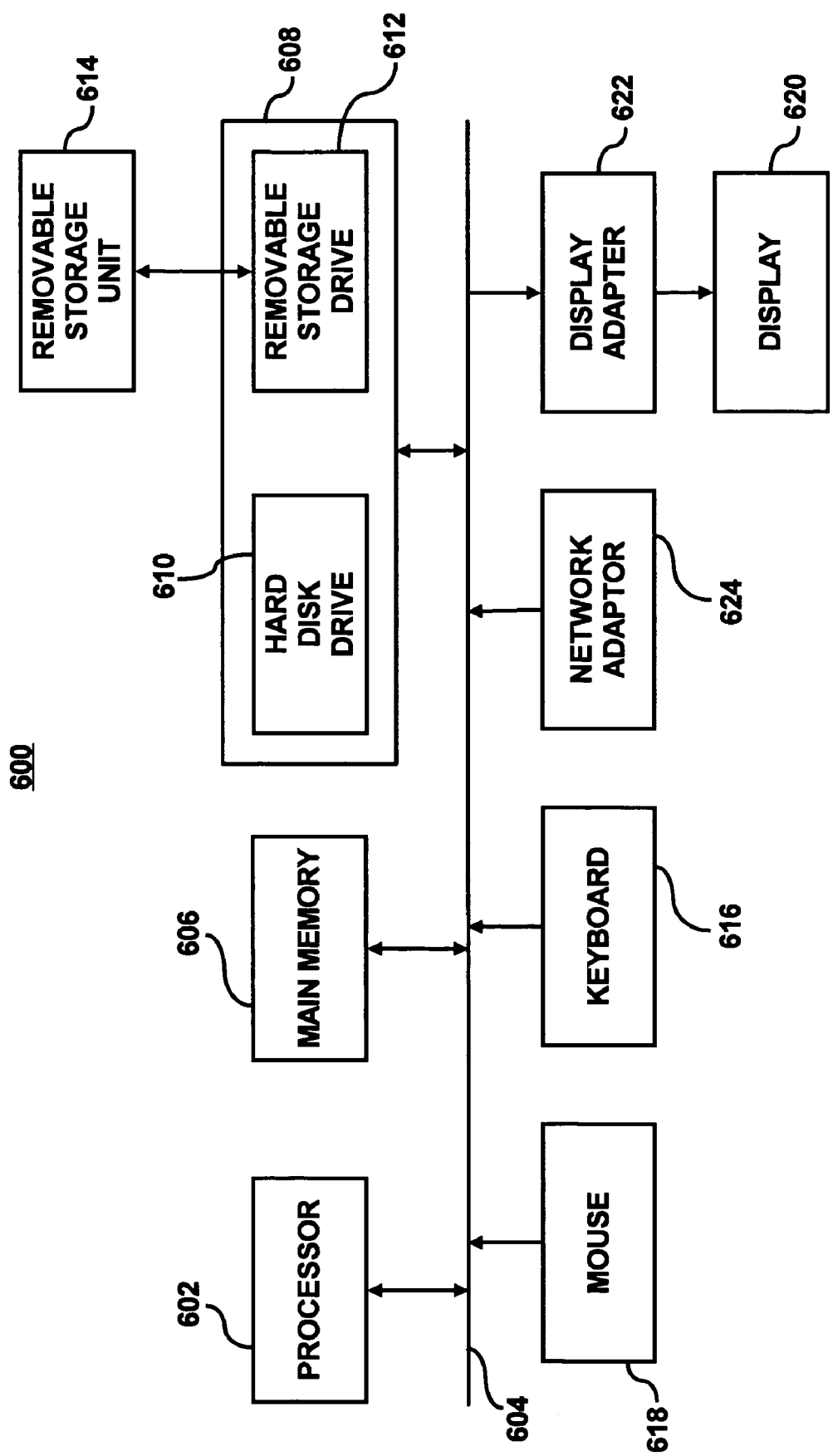
FIG. 6 illustrates a computer system, which may be employed to perform various functions described herein, according to an embodiment of the invention.

FIG. 6 illustrates a computer system 600, which may be employed to perform various functions described herein. The computer system 600 may include, for example, the computing device 128 and/or the controller 204. In this respect, the computer system 600 may be used as a platform for executing one or more of the functions described herein above with respect to the various components of the vent tile control systems 202, 252.

The computer system 600 includes one or more controllers, such as a processor 602. The processor 602 may be used to execute some or all of the steps described in the operational modes 300, 400, 450, and 500. Commands and data from the processor 602 are communicated over a communication bus 604. The computer system 600 also includes a main memory 606, such as a random access memory (RAM), where the program code for, for instance, the computing device 128 or the controller 204, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the vent tile control systems 202, 252 may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of controlling a plurality of vent tiles positioned upstream of a plurality of racks, said method comprising:

measuring mass flow rates of air supplied into a common space through a first vent tile and a second vent tile of the plurality of vent tiles, wherein a first rack and a second rack of the plurality of racks are to receive airflow from the common space;

measuring mass flow rates of air received into each of the first and second racks at multiple mass flow rate settings of the first and second vent tiles;

determining magnitudes of changes to the mass flow rates of air received into each of the first and second racks at the multiple mass flow rate settings of the first and second vent tiles;

determining a respective vent tile family (VTF) of each of the racks, said VTF for each of the first and second racks including those vent tiles that are determined to cause the magnitude of changes to the mass flow rates of airflow received into each of the first and second racks to vary beyond a predetermined threshold in response to changes to the mass flow rate settings of the vent tiles;

identifying a vent control family (VCF) from the vent tiles in the VTF, said VCF including those vent tiles in a VTF of a rack having an inlet condition that is outside of a predefined threshold;

assigning weights to the vent tiles in the VTF according to the determined magnitudes of changes to the mass flow rates of air received into each of the first and second racks at the multiple mass flow rate settings of the first and second vent tiles; and controlling the vent tiles in the VCF based on the assigned weights of the vent tiles.

2. The method according to claim 1, further comprising:

calculating a vent tile influence coefficient (VTI) matrix, wherein the VTI matrix correlates the determined magnitudes of changes to the mass flow rates of air received into each of the racks at multiple mass flow rate settings of the vent tiles.

3. The method according to claim 2, wherein the step of identifying a VCF comprises identifying a subset of the vent tiles in a VTF of a rack that is receiving cool airflow outside of a prescribed range of flow rates.

4. The method according to claim 1, further comprising:

identifying vent tiles that are excluded from the VCF;

assigning the identified VCF excluded vent tiles into a $VTF_{ROW}$ of a row controller, said row controller configured to manipulate vent tiles to control conditions in at least one row of racks;

identifying a $VCF_{ROW}$ of the row controller from the VCF excluded vent tiles in the $VTF_{ROW}$ of the row controller, said $VCF_{ROW}$ of the row controller including vent tiles having an associated at least one row of racks whose inlet condition is outside of a second predefined threshold; and wherein the step of controlling the vent tiles comprises controlling the vent tiles in the $VCF_{ROW}$ of the row controller.

5. The method according to claim 4, further comprising:

determining whether an outer threshold for the VCF is achieved; and wherein the step of assigning the identified $VTF_{ROW}$ of a row controller further comprises assigning the identified $VTF_{ROW}$ of a row controller in response to the outer threshold being achieved and withholding assignment of the identified $VTF_{ROW}$ of a row controller in response to the outer threshold not being achieved.

6. The method according to claim 4, further comprising:

identifying vent tiles that are excluded from the $VCF_{ROW}$;

assigning the identified vent tiles into a $VTF_{ZONE}$ of a zone controller, said zone controller configured to manipulate vent tiles to control conditions in at least one zone of racks;

identifying a $VCF_{ZONE}$ of the zone controller from the vent tiles in the $VTF_{ZONE}$ of the zone controller, said $VCF_{ZONE}$ of the zone controller including vent tiles having an associated at least one zone of racks whose inlet condition is outside of a predefined threshold; and controlling the vent tiles in the $VCF_{ZONE}$ of the zone controller.

7. The method according to claim 6, further comprising:

determining whether an outer threshold for the $VCF_{ROW}$ is achieved; and wherein the step of assigning the identified $VTF_{ZONE}$ of a zone controller further comprises assigning the identified $VTF_{ZONE}$ of a zone controller in response to the outer threshold being achieved and withholding assignment of the identified $VTF_{ZONE}$ of a zone controller in response to the outer threshold not being achieved.

8. A system for controlling vent tiles positioned upstream of a plurality of racks, said system comprising:

means for measuring mass flow rates of air supplied into a common space through a first vent tile and a second vent tile of the plurality of vent tiles, wherein a first rack and a second rack of the plurality of racks are to receive airflow from the common space;

means for measuring mass flow rates of air received into each of the first and second racks at multiple mass flow rate settings of the first and second vent tiles;

means for determining magnitudes of changes to the mass flow rates of air received into each of the first and second racks at the multiple mass flow rate settings of the first and second vent tiles;

means for determining a respective vent tile family (VTF) of each of the racks, said VTF for each of the first and second racks including those vent tiles that are determined to cause the magnitude of changes to the mass flow rates of airflow received into each of the first and second racks to vary beyond a predetermined threshold in response to changes to the mass flow rate settings of the vent tiles;

means for identifying a vent control family (VCF) from the vent tiles in the VTF, said VCF including those vent tiles in a VTF of a rack having an inlet condition that is outside of a predefined threshold;

means for assigning weights to the vent tiles in the VTF according to the determined magnitudes of changes to the mass flow rates of air received into each of the first and second racks at the multiple mass flow rate settings of the first and second vent tiles; and means for controlling the vent tiles in the VCF based on the assigned weights of the vent tiles.

9. The system according to claim 8, further comprising:

means for determining a vent tile influence coefficient (VTI), wherein the VTI correlates the determined magnitudes of changes to the mass flow rates of air received into each of the racks at multiple mass flow rate settings of the vent tiles.

10. The system according to claim 8, further comprising:

means for controlling the vent tiles in a hierarchical manner.

11. A computing device configured to control a plurality of vent tiles positioned upstream of a plurality of racks, said computing device comprising:

an input module to receive measured mass flow rates of air supplied into a common space through a first vent tile and a second vent tile of the plurality of vent tiles, wherein a first rack and a second rack of the plurality of racks are to receive airflow from the common space, said input module further to receive measured mass flow rates of air received into each of the first and second racks at multiple mass flow rate settings of the first and second vent tiles;

an identification module configured to determine magnitudes of changes to the mass flow rates of air received into each of the first and second racks at the multiple mass flow rate settings of the first and second vent tiles;

a vent tile family (VTF) determination module to determine a respective VTF for each of the racks, said VTF for each of the first and second racks including those vent tiles that are determined to cause the magnitude of changes to the mass flow rates of airflow received into each of the first and second racks to vary beyond a predetermined threshold in response to changes to the mass flow rate settings of the vent tiles;

a vent control family (VCF) identification module to identify a VCF from the vent tiles in the VTF, said VCF including those vent tiles in a VTF of a rack having an inlet condition that is outside of a predefined threshold;

an assignment module to assign weights to the vent tiles in the VTF according to the determined magnitudes of changes to the mass flow rates of air received into each of the first and second racks at the multiple mass flow rate settings of the first and second vent tiles; and a controller for controlling the vent tiles in the VCFs based on the assigned weights of the vent tiles.

12. The computing device according to claim 11, wherein the correlation module comprises a module for determining a vent tile influence coefficient (VTI), wherein the VTI correlates the determined magnitudes of changes to the mass flow rates of air received into each of the racks at multiple mass flow rate settings of the vent tiles.

13. The computing device according to claim 12, wherein the controller is configured to estimate quantities of cool air contained in the airflow delivered into the plurality of racks and the VCF identification module is configured to identify a subset of the vent tiles having associated racks that are receiving cool airflow outside of a prescribed range of flow rates.

14. The computing device according to claim 12, wherein the controller is configured to determine whether the temperatures at the inlets of the plurality of racks are outside of a predefined temperature range and to control the vent tiles in the VCF in response to the temperatures at the inlets of the plurality of racks being outside of the predefined temperature range.

15. The computing device according to claim 11, further comprising:

a rack controller configured to control the vent tiles in the VCF of a rack; and a row controller configured to control the vent tiles in a vent control family for a row of racks ($VCF_{ROW}$), wherein the VCF identification module is configured to identify vent tiles that are excluded from the VCF, and wherein the VTF determination module is configured to assign the identified vent tiles into a $VTF_{ROW}$ of the row controller, said row controller being configured to identify the $VCF_{ROW}$ from the vent tiles in the $VTF_{ROW}$.

16. The computing device according to claim 15, further comprising:

a zone controller configured to control the vent tiles in a vent control family for a zone of racks ($VCF_{ZONE}$), wherein the VCF identification module is configured to identify vent tiles that are excluded from the $VCF_{ROW}$, and wherein the VTF determination module is configured to assign the identified vent tiles into a $VTF_{ZONE}$ of the zone controller, said zone controller being configured to identify the $VCF_{ZONE}$ from the vent tiles in the $VTF_{ZONE}$.

17. A non-transitory computer readable storage medium on which is embedded one or more computer programs, said one or more computer programs implementing a method of controlling vent tiles, said one or more computer programs comprising a set of instructions for:

measuring mass flow rates of air supplied into a common space through a first vent tile and a second vent tile of the plurality of vent tiles, wherein a first rack and a second rack of the plurality of racks are to receive airflow from the common space;

measuring mass flow rates of air received into each of the first and second racks at multiple mass flow rate settings of the first and second vent tiles;

determining magnitudes of changes to the mass flow rates of air received into each of the first and second racks at the multiple mass flow rate settings of the first and second vent tiles;

determining a respective vent tile family (VTF) of each of the racks, said VTF for each of the first and second racks including those vent tiles that are determined to cause the magnitude of changes to the mass flow rates of airflow received into each of the first and second racks to vary beyond a predetermined threshold in response to changes to the mass flow rate settings of the vent tiles;

identifying a vent control family (VCF) from the vent tiles in the VTF, said VCF including those vent tiles in a VTF of a rack having an inlet condition that is outside of a predefined threshold;

assigning weights to the vent tiles in the VTF according to the determined magnitudes of changes to the mass flow rates of air received into each of the first and second racks at the multiple mass flow rate settings of the first and second vent tiles; and controlling the vent tiles in the VCF based on the assigned weights of the vent tiles.

18. The tangible computer readable storage medium according to claim 17, said one or more computer programs further comprising a set of instructions for:

calculating a vent tile influence coefficient (VTI) matrix, wherein the VTI matrix correlates the determined magnitudes of changes to the mass flow rates of air received into each of the racks at multiple mass flow rate settings of the vent tiles.

* * * * *